(12) United States Patent
Tamada et al.

(10) Patent No.: US 7,105,074 B2
(45) Date of Patent: Sep. 12, 2006

(54) SUBSTRATE TREATING METHOD AND APPARATUS

(75) Inventors: Osamu Tamada, Kyoto (JP); Tsuyoshi Mitsuhashi, Kyoto (JP); Minobu Matsunaga, Kyoto (JP); Katsushi Yoshioka, Kyoto (JP); Kenji Sugimoto, Kyoto (JP); Kaoru Aoki, Kyoto (JP); Moritaka Yano, Kyoto (JP); Satoshi Yamamoto, Kyoto (JP); Masakazu Sanada, Kyoto (JP); Takashi Nagao, Kyoto (JP); Mitsumasa Kodama, Kyoto (JP)

(73) Assignee: Dainippon Screen Mfg. Co., Ltd. (JP)

(*) Notice: Subject to any disclaimer, the term of this patent is extended or adjusted under 35 U.S.C. 154(b) by 387 days.

(21) Appl. No.: 10/202,279

(22) Filed: Jul. 22, 2002

(65) Prior Publication Data
US 2003/0017665 A1 Jan. 23, 2003

(30) Foreign Application Priority Data

| | | | |
|---|---|---|---|
| Jul. 23, 2001 | (JP) | ............ | 2001-220994 |
| Feb. 13, 2002 | (JP) | ............ | 2002-035183 |
| Apr. 16, 2002 | (JP) | ............ | 2002-113365 |

(51) Int. Cl.
*B05B 3/00* (2006.01)
*B08B 3/00* (2006.01)

(52) U.S. Cl. ............ 156/345.23; 156/345.17; 156/345.21

(58) Field of Classification Search ............ 156/345.23, 156/345.21, 345.17
See application file for complete search history.

(56) References Cited

U.S. PATENT DOCUMENTS

| | | | | |
|---|---|---|---|---|
| 5,608,943 A | * | 3/1997 | Konishi et al. ......... | 15/302 |
| 5,871,584 A | * | 2/1999 | Tateyama et al. ...... | 118/323 |
| 5,985,357 A | * | 11/1999 | Sanada .................. | 427/8 |
| 6,447,608 B1 | * | 9/2002 | Sakai et al. ............ | 118/52 |

FOREIGN PATENT DOCUMENTS

JP  11-221511  8/1999

OTHER PUBLICATIONS

English Translation of JP 11–221511 taken from www4.ipdl.jpo.go.jp.*

* cited by examiner

*Primary Examiner*—Parviz Hassanzadel
*Assistant Examiner*—Sylvia R. MacArthur
(74) *Attorney, Agent, or Firm*—Ostrolenk, Faber, Gerb & Soffen, LLP

(57) ABSTRACT

A substrate treating apparatus is provided for eliminating wasteful consumption of a treating solution in a treating mode in which the treating solution is delivered in a strip form to a substrate from a treating solution delivery nozzle sweeping over the substrate. In a first aspect of the invention, collecting vessels are arranged around a developing cup surrounding a wafer supported by a wafer holder. The collecting vessels collect part of a developer delivered from a discharge opening of a developer delivery nozzle outwardly of a surface of the wafer. In a second aspect of the invention, collecting vessels are arranged below a developer delivery nozzle, with collecting openings of the collecting vessels opposed to a discharge opening or openings of the delivery nozzle. The collecting vessels are moved longitudinally of the discharge openings according to a position of the developer delivery nozzle relative to the wafer.

31 Claims, 15 Drawing Sheets

SUBSTRATE TREATING METHOD AND APPARATUS

BACKGROUND OF THE INVENTION (1) Field of the Invention

The present invention relates to substrate treating methods and apparatus for performing a predetermined treatment of substrates such as semiconductor wafers by supplying a treating solution such as a developer, resist solution or rinse solution in a generally strip form to a surface of each substrate.

(2) Description of the Related Art

In a semiconductor device manufacturing process, for example, a slit scan developing mode has been in wide use in recent years as one of the methods for developing photoresist film formed on the surface of a semiconductor wafer. In this developing mode, as disclosed in Japanese Patent Publication (Unexamined) No. 1999-221511, for example, while a developer delivery nozzle having a discharge opening in slit form in a lower surface thereof is moved horizontally and linearly from one end to the other end of a wafer held still and in horizontal posture by a wafer holder, a developer is delivered from the discharge opening of the delivery nozzle to the surface of the wafer to form a puddle of the developer thereon. By forming a puddle of the developer on the wafer held still in this way, a resulting resist film pattern has a greatly improved line width uniformity.

However, while a planar area in which the developer delivery nozzle moves is rectangular, a developing cup surrounding the semiconductor wafer and adjacent areas has a circular circumference. As a result, part of the developer delivered from the slit-shaped discharge opening of the developer delivery nozzle falls outwardly of the wafer surface to be drained and abandoned without forming the puddle. This constitutes a problem of wasteful consumption of the developer.

SUMMARY OF THE INVENTION

The present invention has been made having regard to the state of the art noted above, and its primary object is to provide substrate treating method and apparatus for eliminating a wasteful consumption of a treating solution in a treating mode in which the treating solution is delivered from a discharge opening of a solution delivery nozzle to a substrate while the nozzle sweeps over the substrate, the discharge opening being in slit form or in the form of a plurality of small perforations juxtaposed.

The above object is fulfilled, according one aspect of the present invention, by a substrate treating method for performing a predetermined treatment of a substrate by supplying a treating solution thereto, the method comprising a treating solution delivering step for delivering the treating solution in a generally strip form from a treating solution delivery nozzle toward the substrate in horizontal posture, a horizontally moving step for moving the treating solution delivery nozzle horizontally relative to the substrate, and a treating solution collecting step for collecting part of the treating solution delivered from the treating solution delivery nozzle outwardly of the substrate, in a collecting vessel device arranged around a cup surrounding the substrate.

According to the invention, the treating solution is delivered in a generally strip form from the treating solution delivery nozzle to the substrate while moving the nozzle horizontally relative to the substrate. When part of the treating solution is delivered outwardly of the surface of the substrate, that part of the treating solution falls into the collecting vessel device arranged around the cup to be collected therein. As a result, the unused part of the treating solution heretofore abandoned may be collected to eliminate the wasteful consumption of the treating solution.

In another aspect of the invention, a substrate treating apparatus is provided for performing a predetermined treatment of a substrate by supplying a treating solution thereto, the apparatus comprising a substrate supporting device for supporting the substrate in horizontal posture, a cup for surrounding the substrate supported by the substrate supporting device, a treating solution delivery nozzle having a solution discharge opening for delivering the treating solution to the substrate, the solution discharge opening being in form of a slit or a plurality of small perforations arranged in a lower surface of the treating solution delivery nozzle, a horizontally moving device for moving the treating solution delivery nozzle horizontally relative to the substrate, and a collecting vessel device arranged around the cup for collecting part of the treating solution delivered from the treating solution delivery nozzle outwardly of the substrate.

This apparatus implements the above method according to the invention in an effective way.

Preferably, the collecting vessel device is supported to be movable between a collecting position and a retracted position, the collecting vessel device in the collecting position collecting the part of the treating solution delivered from the treating solution delivery nozzle outwardly of the substrate. With this construction, the collecting vessel device is moved to the retracted position when no treating solution is delivered from the treating solution delivery nozzle to the substrate, to present no obstruction to other operations.

Preferably, the collecting vessel device has a surface opposed and close to the cup, shaped to follow an outer profile of the cup. With this construction, only a small space is formed between the outer periphery of the cup and the opposite surface of the collecting vessel device. Thus, the collecting vessel device can collect an increased quantity of the treating solution delivered from the solution discharge opening of the treating solution delivery nozzle outwardly of the surface of the substrate.

Preferably, the apparatus further comprises a lift device for vertically moving the cup relative to the substrate, the collecting vessel device being integrated with the cup to be vertically movable with the cup relative to the substrate. With this construction, when the treating solution is delivered from the treating solution delivery nozzle to the substrate, the cup is moved downward relative to the substrate. At this time, the collecting vessel device integrated with the cup also is moved downward relative to the substrate. The treating solution delivered from the solution discharge opening of the treating solution delivery nozzle outwardly of the surface of the substrate is collected in the collecting vessel device in the lowered position. When no treating solution is delivered from the treating solution delivery nozzle to the substrate, e.g. when deionized water is delivered to the substrate spun upon lapse of a predetermined time from formation of a puddle of developer on the substrate, the cup is moved upward relative to the substrate, and so is the collecting vessel device integrated with the cup. This prevents the deionized water and developer scattering from the substrate from mixing into the treating solution (developer) in the collecting vessel device.

Preferably, the collecting vessel device is connected to a treating solution storage tank through collecting piping.

With this construction, the treating solution delivered from the solution discharge opening of the treating solution delivery nozzle outwardly of the surface of the substrate and collected in the collecting vessel device is transmitted through the collecting piping to the treating solution storage tank to be stored therein. As a result, the treating solution collected and stored in the treating solution storage tank may be recycled.

Further, it is preferred that the collecting piping has a switch valve mounted thereon. This construction is effective to prevent the treating solution stored in the treating solution storage tank from contacting air through the collecting piping.

Preferably the apparatus further comprises a cleaning and drying device for cleaning and drying inner surfaces of the collecting vessel device. With this construction, the cleaning and drying device may be operated to clean and dry the inner surfaces of the collecting vessel device as appropriate. This operation may be carried out to prevent variations in the concentration of the treating solution collected in the collecting vessel device caused by a treating solution such as a developer adhering to the inner surfaces of the collecting vessel device.

The present invention is applicable to recovery of a treating solution such as a developer, resist solution or rinse solution supplied to the surface of a substrate such as a semiconductor wafer. In particular, the invention may advantageously be used for recovery of a developer in what is known as the slit scan developing mode.

Further, the present invention provides a substrate treating method for performing a predetermined treatment of a substrate by supplying a treating solution thereto, the method comprising a treating solution delivering step for delivering the treating solution in a generally strip form from a treating solution delivery nozzle toward the substrate in horizontal posture, a horizontally moving step for moving the treating solution delivery nozzle horizontally relative to the substrate, and a treating solution collecting step for collecting part of the treating solution delivered from the treating solution delivery nozzle outwardly of the substrate, by using a collecting vessel device defining a collecting opening for receiving the treating solution delivered from the treating solution delivery nozzle, the collecting opening being disposed below the treating solution delivery nozzle to be opposed to a solution discharge opening of the treating solution delivery nozzle.

The present invention solves the following technical problem also.

The following method may be adopted, for example, to check the wasteful consumption of the treating solution, but an inconvenience will be encountered. It is conceivable to reduce the treating solution falling outwardly of the surface of the substrate in time of movement of the treating solution delivery nozzle, by delivering the treating solution to the substrate while varying, according to the diameter of the substrate, the delivery width of the slit-like solution discharge opening (slit length of the solution discharge opening) of the treating solution delivery nozzle, i.e. while varying the delivery area of the solution discharge opening of the delivery nozzle. However, such a method produces a phenomenon of variations in the flow rate of the treating solution delivered from the treating solution delivery nozzle to the substrate. Within one sweeping motion of the treating solution delivery nozzle over the substrate, variations occur in the flow rate of the treating solution delivered from the treating solution delivery nozzle to the substrate. The variations in the flow rate cause a problem of uneven treatment (e.g. uneven development) which lowers the accuracy of treatment (e.g. accuracy of development).

According to the present invention, on the other hand, since the solution discharge opening of the treating solution delivery nozzle has an invariable delivery area, variations due to variations in the delivery area never occur in the flow rate of the treating solution but the treating solution is delivered at a fixed rate from the treating solution delivery nozzle to the substrate. As a result, the substrate is free from uneven treatment due to variations in the flow rate of the treating solution delivered to the substrate. Further, the part of the treating solution delivered from the treating solution delivery nozzle outwardly of the substrate is collected at the collecting opening of the collecting vessel device disposed below and opposed to the solution discharge opening of the delivery nozzle. The treating solution is exposed to air only from delivery from the solution discharge opening until arrival at the collecting opening. This reduces the exposure to air of the treating solution, thereby reducing variations in characteristics due to the exposure to air of the treating solution. The treating solution may be reused in an excellent condition.

It is preferred, in the present invention, that the treating solution collecting step is executed to move the collecting vessel device longitudinally of the solution discharge opening so as to follow peripheral edges of the substrate as spaced therefrom. According to this feature, since the collecting vessel device is moved longitudinally of the solution discharge opening so as to follow peripheral edges of the substrate as spaced therefrom, the treating solution delivered to the surface of the substrate and used for substrate treatment is prevented from flowing into the collecting opening of the collecting vessel device. The collecting vessel device collects, through the collecting opening, only unused part of the treating solution, i.e. the treating solution delivered outwardly of the surface of substrate and not supplied for substrate treatment. This results in improved quality of the treating solution collected.

The invention provides an apparatus for implementing the above method in an effective way.

That is, in a further aspect of the invention, a substrate treating apparatus is provided for performing a predetermined treatment of a substrate by supplying a treating solution thereto, the apparatus comprising a substrate supporting device for supporting the substrate in horizontal posture, a treating solution delivery nozzle having a solution discharge opening for delivering the treating solution to the substrate, the solution discharge opening being in form of a slit or a plurality of small perforations arranged in a lower surface of the treating solution delivery nozzle, a horizontally moving device for moving the treating solution delivery nozzle horizontally relative to the substrate, and a collecting vessel device defining a collecting opening for receiving the treating solution delivered from the treating solution delivery nozzle, the collecting opening being disposed below the treating solution delivery nozzle to be opposed to the solution discharge opening of the treating solution delivery nozzle, the collecting vessel device receiving and collecting part of the treating solution delivered from the treating solution delivery nozzle outwardly of the substrate.

Preferably, the apparatus further comprises a nozzle position detecting device for detecting positions of the treating solution delivery nozzle relative to the substrate, and a collecting vessel moving device for moving the collecting vessel device longitudinally of the solution discharge opening in response to the positions of the treating solution delivery nozzle detected by the nozzle position detecting device, the collecting vessel device being movable longitudinally of the solution discharge opening by the collecting vessel moving device so as to follow peripheral edges of the substrate as spaced therefrom.

Preferably, the collecting vessel device includes two collecting vessels juxtaposed longitudinally of the solution discharge opening, the solution discharge opening having a length bisected to define a first range and a second range, one of the collecting vessels being movable over the first range, and the other of the collecting vessels being movable over the second range.

With this construction, since the two collecting vessels are movable longitudinally of the solution discharge opening so as to follow the peripheral edges of the substrate, the two collecting vessels can collect an unused treating solution at opposite ends of the treating solution delivery nozzle, respectively.

Preferably, the collecting opening has a funnel-shaped vertical section. This construction allows the treating solution delivered from the treating solution delivery nozzle to enter the collecting opening smoothly.

Preferably, the horizontally moving device is arranged to move the treating solution delivery nozzle horizontally, and the collecting vessel device is horizontally movable synchronously with the treating solution delivery nozzle.

With this construction, the treating solution delivered from the treating solution delivery nozzle moving horizontally is collected smoothly by the collecting vessel device moving horizontally and synchronously with the treating solution delivery nozzle.

It is preferred in this case that the collecting vessel device is connected to the treating solution delivery nozzle. This construction can move the collecting vessel device with movement of the treating solution delivery nozzle without requiring a dedicated moving device for moving the collecting vessel device.

Preferably, the apparatus further comprises a circulating device for supplying the treating solution collected through the collecting opening to the treating solution delivery nozzle to be delivered from the treating solution delivery nozzle. The circulating device includes, for example, a treating solution storage device connected to the treating solution delivery nozzle for storing the treating solution to be supplied to the treating solution delivery nozzle, and a supplying device connected to the collecting vessel device for supplying the treating solution collected in the collecting vessel device to the treating solution storage device. With this construction, the unused treating solution delivered outwardly of the surface of the substrate is collected at the collecting opening of the collecting vessel device and delivered from the treating solution delivery nozzle. In this way, the unused treating solution may be recycled for repeated use.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Preferred embodiments of the present invention will be described in detail hereinafter with reference to the drawings.

First Embodiment

Figure 1:
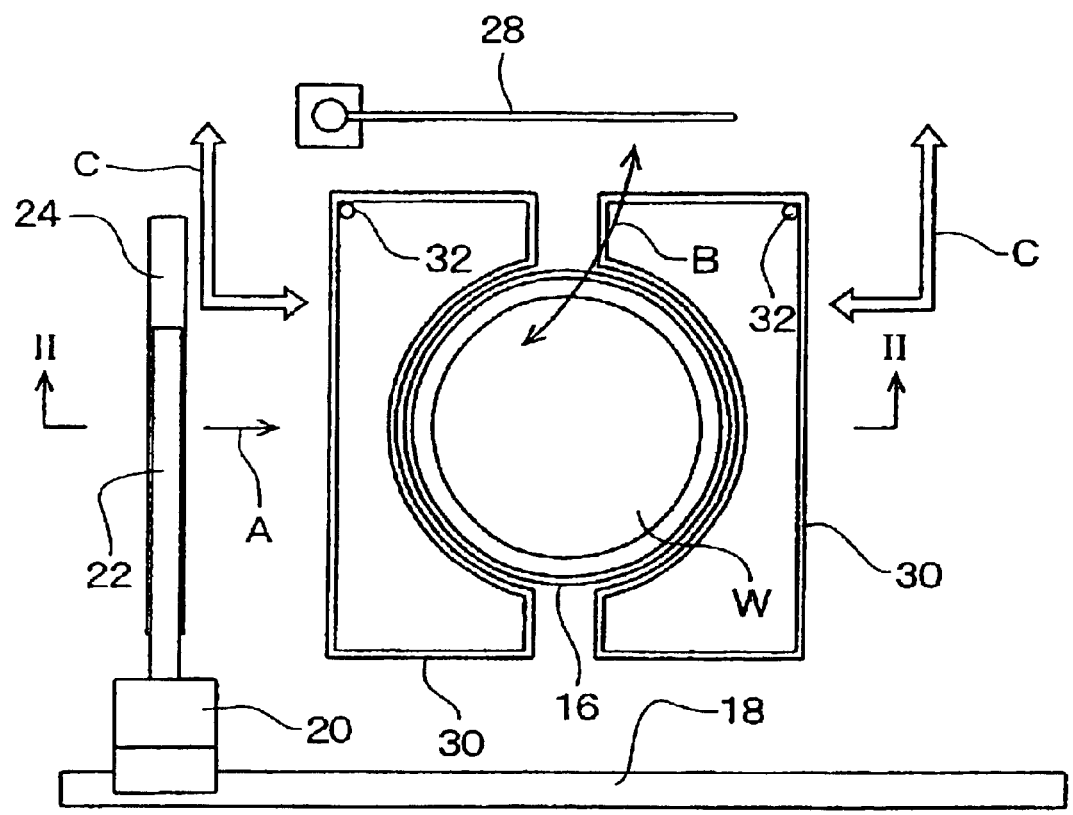
FIG. 1 is a plan view schematically showing a developing apparatus, which is one type of substrate treating apparatus, in a first embodiment of the invention.
Figure 2:
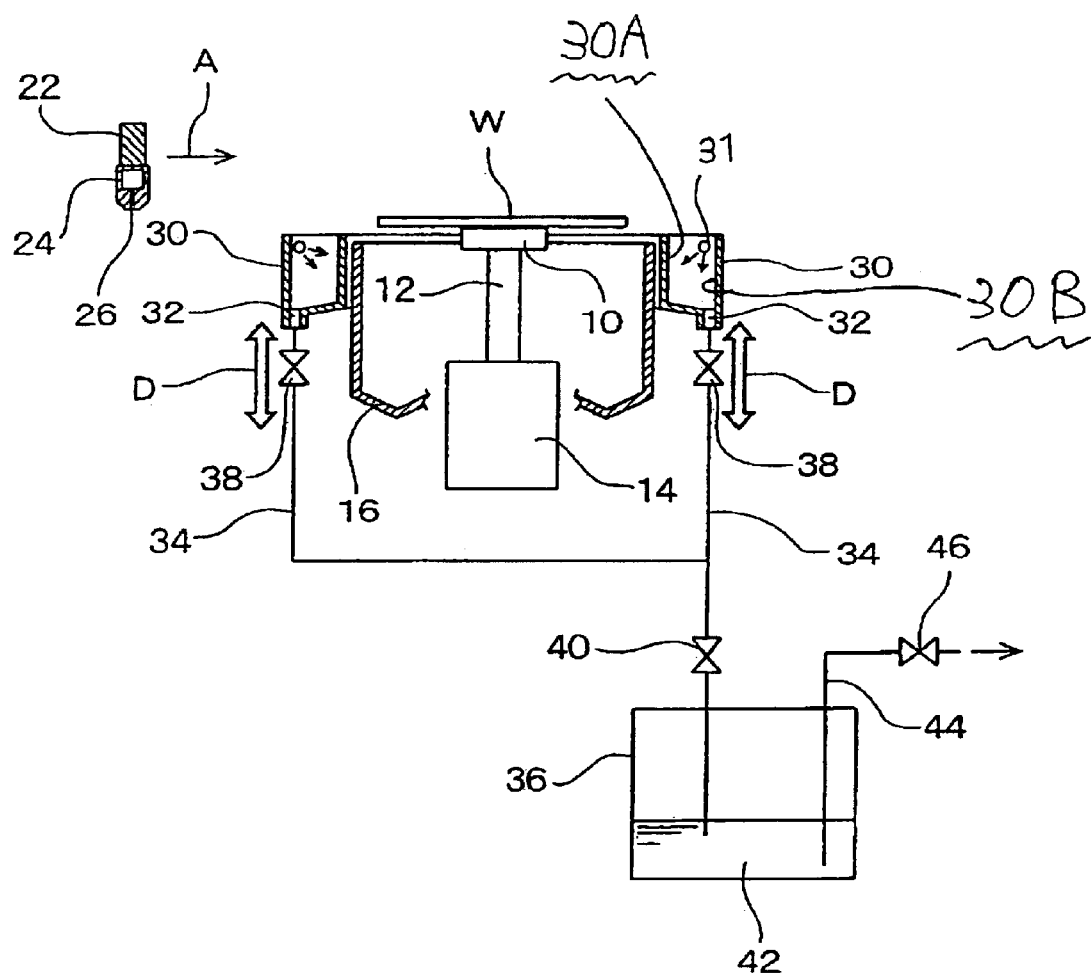
FIG. 2 is a section taken on line II—II of FIG. 1.

FIGS. 1 and 2 show a first embodiment of the invention. FIG. 1 is a plan view schematically showing a developing apparatus which is one type of substrate treating apparatus. FIG. 2 is a section taken on line II—II of FIG. 1.

This developing apparatus includes a wafer holder 10 for suction-supporting a substrate, e.g. semiconductor wafer W, in horizontal posture, a vertical rotary support shaft 12 having the wafer holder 10 secured to an upper end thereof, and a spin motor 14 with a rotary shaft connected to the rotary support shaft 12 for rotating the latter about a vertical axis. A circular developing cup 16 is disposed around the wafer holder 10 to surround the wafer W on the wafer holder 10. The developing cup 16 is supported to be vertically reciprocable.

A guide rail 18 is disposed at one side of the developing cup 16. The guide rail 18 has an arm driver 20 slidably mounted thereon and supporting a nozzle arm 22. A developer delivery nozzle 24 is suspended in horizontal posture from the nozzle arm 22. The developer delivery nozzle 24 is oriented in a direction perpendicular to the guide rail 18. The developer delivery nozzle 24 has a discharge opening 26 in slit form extending longitudinally of a lower surface thereof, and is connected to a developer source through a developer supplying pipe not shown. The nozzle arm 22 is movable by the arm driver 20 horizontally and linearly along the guide rail 18, to move the developer delivery nozzle 24 in the direction indicated by arrow A. During this movement, the developer delivery nozzle 24 may deliver a developer from the solution discharge opening 26 to the wafer W. After a puddle of developer is formed on the wafer W, the developer delivery nozzle 24 is moved in the direction opposite to the direction of arrow A back to an original position.

A deionized water delivery nozzle 28 is disposed at the other side of the developing cup 16 for delivering deionized water (as rinse liquid) to the wafer W upon lapse of a predetermined time from the puddle formation, to stop the developing reaction. The deionized water delivery nozzle 28 is connected to a deionized water source through a deionized water supplying pipe not shown. The deionized water delivery nozzle 28 is supported to be swingable in a horizontal plane in the directions indicated by arrow B.

This apparatus includes collecting vessels 30 arranged around the developing cup 16 for collecting part of the developer delivered from the discharge opening 26 of the developer delivery nozzle 24 outwardly of the surface of wafer W. In the illustrated example, a pair of collecting vessels 30 are arranged forwardly and rearwardly of the developing cup 16 in the direction of movement of the developer delivery nozzle 24. However, one collecting vessel 30 may be disposed only forwardly or rearwardly of the developing cup 16.

Figure 3:
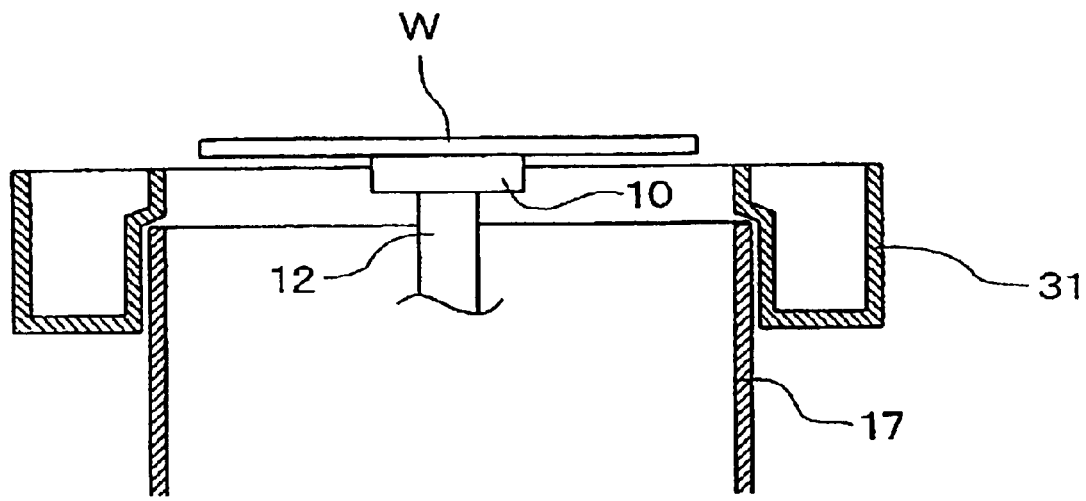
FIG. 3 is a schematic sectional view showing collecting vessels having a shape different from what is shown in FIG. 1.

The collecting vessels 30 have a generally rectangular configuration whose dimension in the direction perpendicular to the direction of movement of the developer delivery nozzle 24 is equal to or slightly larger than the dimension in the direction of movement of the developer delivery nozzle 24. Each collecting vessel 30 has a side surface thereof opposed and close to the developing cup 16, which surface is formed arcuate to follow an outer profile of the developing cup 16, with little space left between the collecting vessel 30 and developing cup 16. Of course, the shape of collecting vessels 30 is not limited to the illustrated example. As shown in FIG. 3, for example, the collecting vessels 30 may have upper portions protruding to positions over the top of developing cup 17 close to peripheral edges of wafer W.

The collecting vessels 30 define developer drain ports 32 to which collecting piping 34 is connected, respectively. The collecting piping 34 extends in fluid communication to a developer storage tank 36. The collecting piping 34 has switch valves 38 and 40 mounted thereon adjacent each collecting vessel 30 and adjacent the developer storage tank 36. The developer storage tank 36 has a sealed structure for storing the developer 42 therein. A withdrawing pipe with a switch valve 46 extends into the developer storage tank 36.

Each collecting vessel 30 is supported to be movable between a collecting position (the position shown in FIGS. 1 and 2) and a retracted position. In the collecting position, each collecting vessel 30 collects the developer delivered from the discharge opening 26 of the developer delivery nozzle 24 outwardly of the surface of wafer W. The retracted position may be located in the same horizontal plane as the collecting position, so that each collecting vessel 30 is reciprocated in that horizontal plane as indicated by arrow C in FIG. 1. Alternatively, the retracted position may be located below the collecting position, so that each collecting vessel 30 is raised and lowered between the collecting position and retracted position as indicated by arrow D in FIG. 2. The collecting vessels 30 may be fixed to the position shown in FIGS. 1 and 2 as long as their presence is not obstructive to operation of the apparatus.

As shown in FIG. 2, each collecting vessel 30 may include a cleaning and drying device 31 for cleaning and drying inner surfaces thereof. The cleaning and drying device 31 may be operated, when appropriate, to clean and dry the inner surfaces of each collecting vessel 30. This operation will prevent the developer from remaining on the inner surfaces of collecting vessels 30, thereby varying the concentration of the developer collected. In this case, a cleaning solution used in the cleaning operation is drained, separately from the developer, through drain piping not shown.

Figure 4:
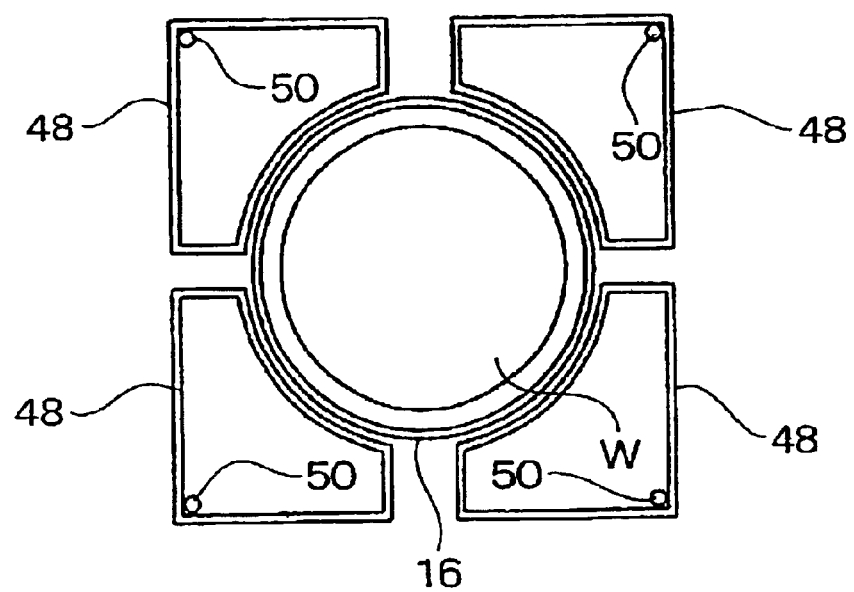
FIG. 4 is a schematic plan view showing other collecting vessels having a shape different from what is shown in FIG. 1.
Figure 5:
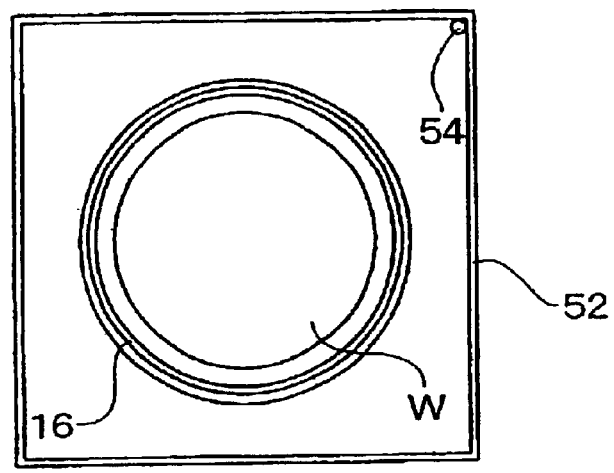
FIG. 5 is a schematic plan view showing a further modified collecting vessel.

The collecting vessels may have a planar profile other than what is shown in FIG. 1. As shown in FIG. 4, for example, four collecting vessels 48 may be formed by bisecting each of the two forward and rearward collecting vessels 30 shown to FIG. 1, in the direction perpendicular to the direction of movement of the developer delivery nozzle 24. The collecting vessels may even be further subdivided. Such a construction does not require large spaces for moving the collecting vessels 48 from the collecting position to the retracted position, but can easily retract the collecting vessels 48. Numeral 50 in FIG. 4 denotes developer drain ports. Where the collecting vessels may be fixed without impeding operation, as shown in FIG. 5, a collecting vessel 52 may be provided as integrated with the developing cup 16. With this construction, the collecting vessel 52 is capable of collecting an increased quantity of unused part of the developer delivered from the developer delivery nozzle 24 outwardly of the surface of wafer W. Numerals 50 and 54 in FIGS. 4 and 5 denote developer drain ports.

One example of treating operation by the developing apparatus having the above construction will be described next.

A wafer W with photoresist film formed and exposed on a surface thereof is loaded into the apparatus. When the wafer W is placed on the wafer holder 10, the collecting vessels 30 are moved to the collecting position. Subsequently, the developer is supplied from the developer source through the developer supplying pipe into the developer delivery nozzle 24. While delivering the developer from the slit-shaped discharge opening 26 to the wafer W (treating solution delivering step), the developer delivery nozzle 24 is moved in the direction of arrow A by the arm driver 20 (horizontally moving step). As a result, the developer is supplied to the wafer W and forms a puddle thereon. The part of the developer delivered from the discharge opening 26 of the developer delivery nozzle 24 outwardly of the surface of wafer W falls into the collecting vessels 30 (treating solution collecting step). The developer falling into the collecting vessels 30 flows through the collecting piping 34 to be collected and stored in the developer storage tank 36. The developer 42 stored in the developer storage tank 36 is checked and, as necessary, adjusted for concentration by way of recycling.

After the puddle is formed on the wafer W, the arm driver 20 moves the developer delivery nozzle 24 in the direction opposite to the direction indicated by arrow A, back to the original position. Next, the collecting vessels 30 are moved from the collection position to the retracted position, and the switch valves 38 and 40 mounted on the collecting piping 34 are closed. By closing the switch valves 38 and 40 mounted on the collecting piping 34, the developer 42 stored in the developer storage tank 36 is prevented from contacting air through the collecting piping 34.

Next, the developing cup 16 is raised and upon lapse of the predetermined time from the puddle formation on the wafer W, the deionized water delivery nozzle 28 is operated to deliver deionized water to the wafer W to stop the developing reaction of the photoresist film on the surface of wafer W. Subsequently, the spin motor 14 is operated to spin the wafer W on the wafer holder 10 in a horizontal plane about a vertical axis, thereby to dry the wafer W. When the wafer W has been dried, the spin motor 14 is stopped and the wafer W is unloaded from the apparatus.

Figure 6:
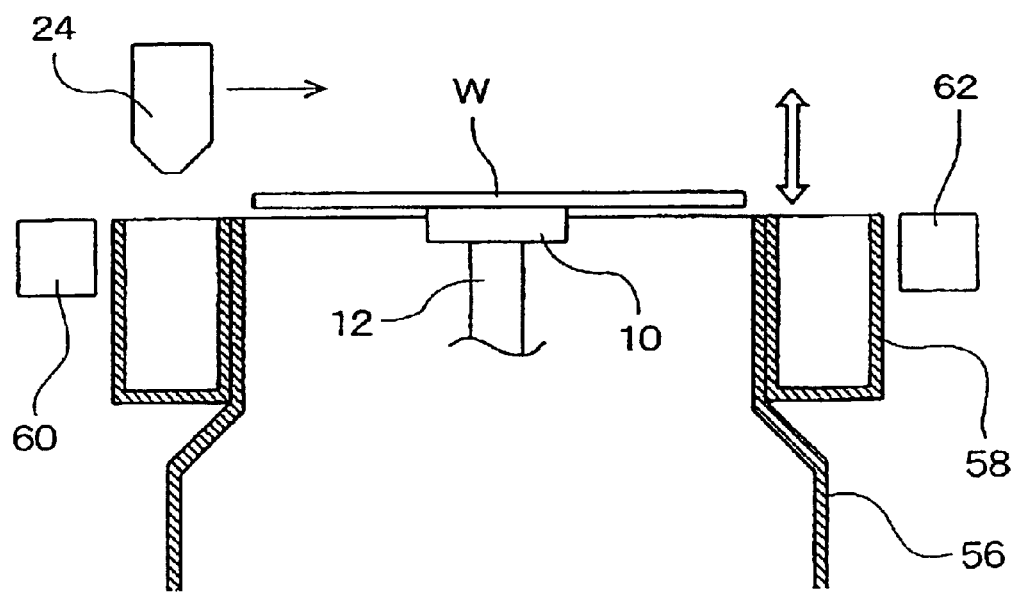
FIG. 6 is a schematic sectional view for illustrating operation of a developing apparatus having a collecting vessel integrated with a developing cup, with a developer delivery nozzle delivering a developer to a wafer.
Figure 7:
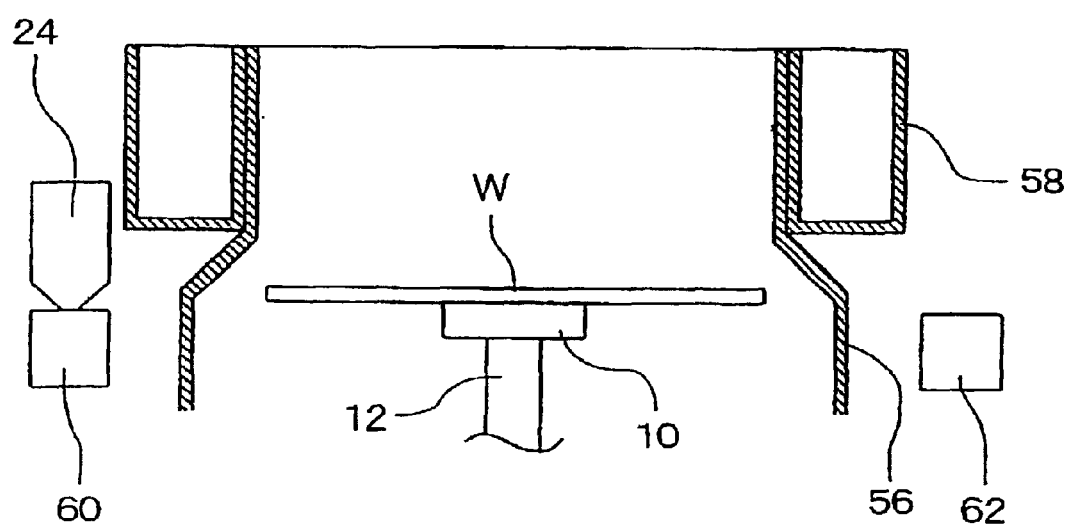
FIG. 7 is a view similar to FIG. 6, showing a state in which a deionized water delivery nozzle delivers deionized water to the wafer after the developer is supplied to the wafer.

Next, FIGS. 6 and 7 are explanatory views illustrating a treating operation of the developing apparatus having a collecting vessel integrated with the developing cup as shown in FIG. 5. The developing cup 56 of this apparatus has a larger diameter in a lower cylindrical portion thereof than in an upper portion defining an opening. This shape is adopted in order to reduce rebounds from inner walls of the developing cup 56 of the deionized water and developer scattering from the wafer W in time of spin-drying the wafer W after the deionized water is delivered to the wafer W with the developing cup 56 raised as shown in FIG. 7. A collecting vessel 58 is fixed to an outer peripheral wall of the upper small-diameter portion of the developing cup 56 for collecting unused part of the developer delivered from the delivery nozzle 24 to the wafer W. Numerals 60 and 62 denote standby positions of the developer delivery nozzle 24.

With the apparatus having the above construction, when the developer delivery nozzle 24 is operated to form a puddle of developer on the wafer W, as shown in FIG. 6, the developing cup 56 and collecting vessel 58 are maintained still slightly below the wafer W. In this state, the developer delivery nozzle 24 is moved in the direction indicated by an arrow, while delivering the developer from the slit-shaped discharge opening of developer delivery nozzle 24 to the wafer W. As a result, the developer forms a puddle on the wafer W, and part of the developer delivered outwardly of the surface of wafer W is collected in the collecting vessel 58.

After the developer is supplied to the wafer W, as shown in FIG. 7, the developer delivery nozzle 24 moves to the standby position 60, the developing cup 56 is raised, along with the collecting vessel 58 integrated therewith, and stopped above the wafer W by a lift mechanism not shown. Upon lapse of the predetermined time from the puddle formation on the wafer W, the deionized water delivery nozzle (omitted from FIGS. 6 and 7) is operated to deliver deionized water to the wafer W to stop the developing reaction of the photoresist film on the surface of wafer W. Subsequently, the wafer W is spin-dried on the wafer holder 10. Since the top opening of collecting vessel 58 is located above the wafer W at this time, the deionized water and developer scattering from the wafer W, which may be in mist form, never mixes with the developer in the collecting vessel 58. When the wafer W has been dried, the developing cup 56 and collecting vessel 58 are moved back to the lower position, and thereafter the wafer W is unloaded from the apparatus.

In the above embodiment, the developing apparatus includes the developer delivery nozzle 24 having the slit-shaped discharge opening 26 in the lower surface thereof. The invention is equally applicable to an apparatus including a developer delivery nozzle having porous discharge openings with a plurality of small perforations arranged longitudinally of a lower surface thereof. While the above embodiment has been described in relation to the developing apparatus, the invention is applicable also to other types of substrate treating apparatus.

Second Embodiment

Figure 8:
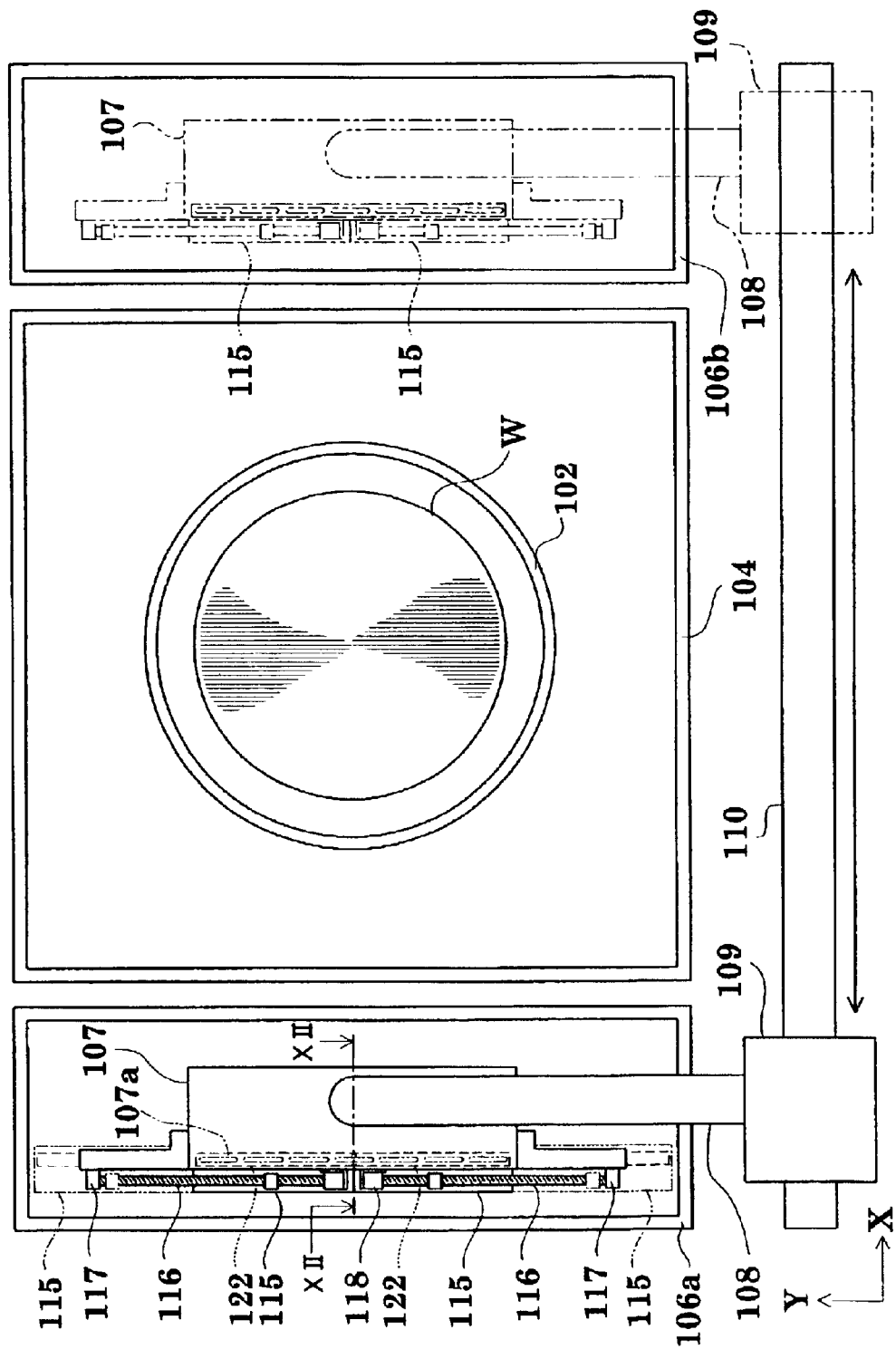
FIG. 8 is a plan view schematically showing a substrate treating apparatus in a second embodiment of the invention.
Figure 9:
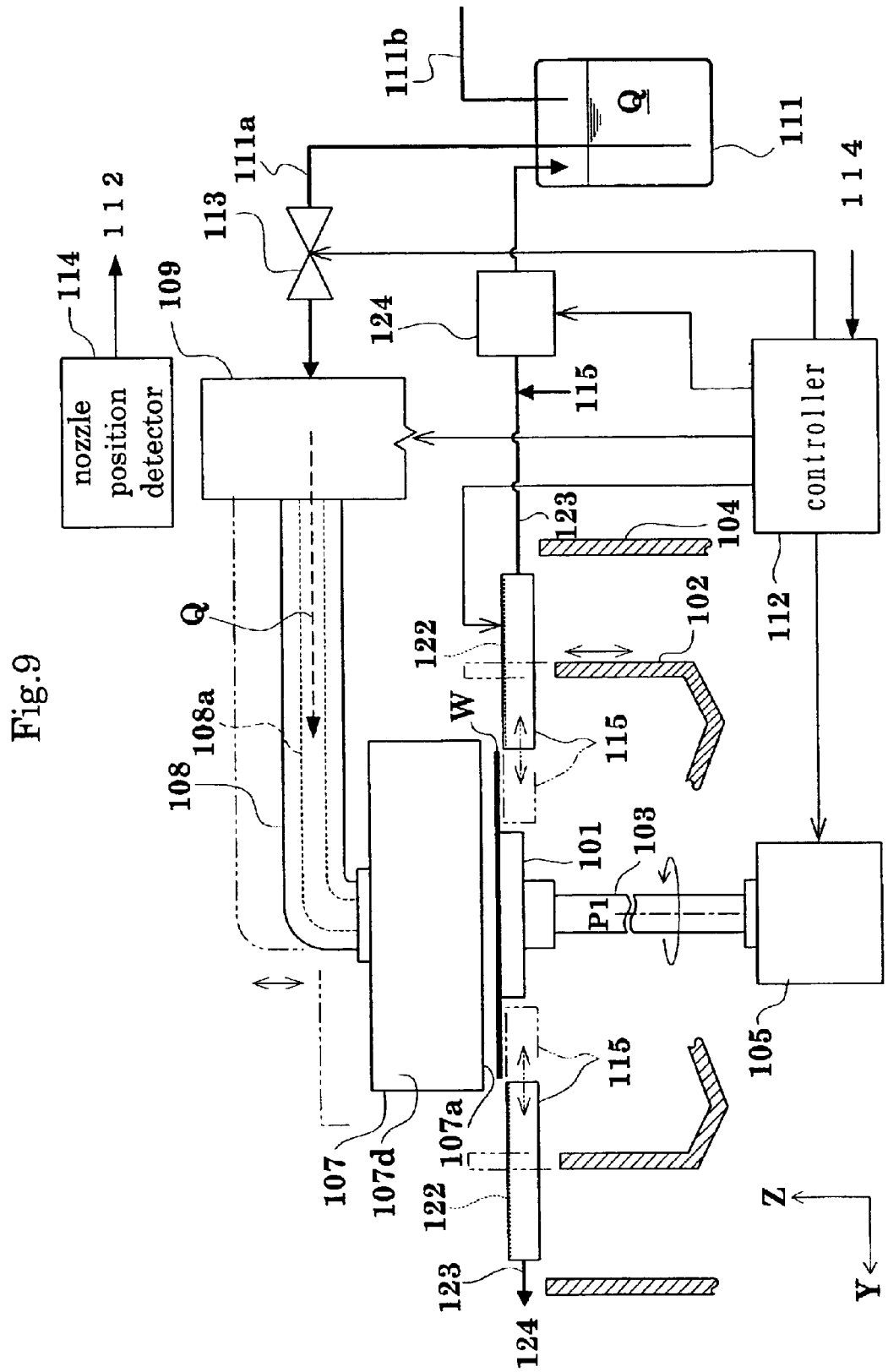
FIG. 9 is a side view of the substrate treating apparatus shown in FIG. 8.

FIG. 8 is a plan view schematically showing a substrate treating apparatus in a second embodiment of the invention. FIG. 9 is a side view of the apparatus.

This embodiment will be described by taking for example a substrate developing apparatus having a treating solution delivery nozzle for delivering a developer as a treating solution to a substrate such as a semiconductor wafer (hereinafter referred to simply as "wafer"). The invention is not limited to this apparatus, but has wide application to varied substrate treating apparatus, and to solution delivery nozzles for use in these apparatus, for treating wafers by delivering appropriate treating solutions (e.g. a resist solution and rinse solution) to wafer surfaces.

As shown in FIG. 9, this substrate developing apparatus includes a wafer holder 101 for supporting a wafer W in horizontal posture. The wafer holder 101 is interlocked to an electric motor 105 through a rotary shaft 103, and also connected to a vacuum line not shown to support the wafer W by vacuum suction. The wafer holder 101 is driven by the electric motor 105 to spin about an axis P1 while supporting the wafer W. The wafer holder 101 corresponds to the substrate supporting device of the invention.

Around the wafer holder 101 is an inner cup 102 for surrounding the wafer W supported by the wafer holder 101. The inner cup 102 is constructed vertically movable by a lift mechanism not shown, and is raised when the wafer W is spun to prevent a developer forming a puddle on the wafer W from scattering to the ambient. The developer scattering inside the inner cup 102 is collected through a drain collecting structure, not shown, provided for the inner cup 102. When the spin of wafer W is completed, the inner cup 102 is lowered to allow the wafer W to be removed from the wafer holder 101. The inner cup 102 is surrounded by a substantially square outer cup 104.

As shown in FIG. 8, standby pots 106a and 106b are arranged at opposite sides of the outer cup 104 for receiving a solution delivery nozzle 107, described hereinafter, on standby. Further, a guide rail 110 is disposed laterally of the outer cup 104. A nozzle drive mechanism 109 is mounted to be slidable along the guide rail 110. The solution delivery nozzle 107 is supported in cantilever fashion by a support arm 108 vertically movably supported by the nozzle drive mechanism 109. With sliding of the nozzle drive mechanism 109, the solution delivery nozzle 107 is movable back and forth in the X-direction. The above nozzle drive mechanism 109 and guide rail 110 constitute the horizontally moving device of the invention.

As shown in FIG. 9, the support arm 108 contains a solution feed pipe 108a mounted as an integral part thereof and communicating with the solution delivery nozzle 107 supported in cantilever fashion by the support arm 108. Further, the solution feed pipe 108a communicates at a proximal end of the support arm 108 with a developer supply line 111a connected to a developer tank 111. A switch valve 113 is mounted on the developer supply line 111a for opening and closing the developer supply line 111a on instructions from a controller 112.

The developer tank 111 with the developer supply line 111a connected thereto also has a nitrogen pressurizing line 111*b* connected for pressurizing the developer Q stored therein. The developer tank 111 corresponds to the treating solution storage tank of the invention.

As shown in FIG. 9, the substrate developing apparatus includes a nozzle position detector 114 for detecting positions of the nozzle 107 relative to the wafer W. The wafer holder 101 supporting the wafer W, the nozzle drive mechanism 109 supporting the nozzle 107 and the standby pots 106*a* and 106*b* are in a known positional relationship. A distance the nozzle drive mechanism 109 slides along the guide rail 110 may be computed by detecting, with an encoder or the like (not shown), an amount of rotation of a motor (not shown) for sliding the nozzle drive mechanism 109. Based on the above, a position of the nozzle 107 relative to the wafer W may be detected. A position detecting sensor, optical sensor or the like may be employed as the nozzle position detector 114 for detecting positions of the nozzle 107 relative to the wafer W. Positions of the nozzle 107 relative to the wafer W detected by the nozzle position detector 114 are outputted to the controller 112. The nozzle position detector 114 corresponds to the nozzle position detecting device of the invention.

Figure 10:
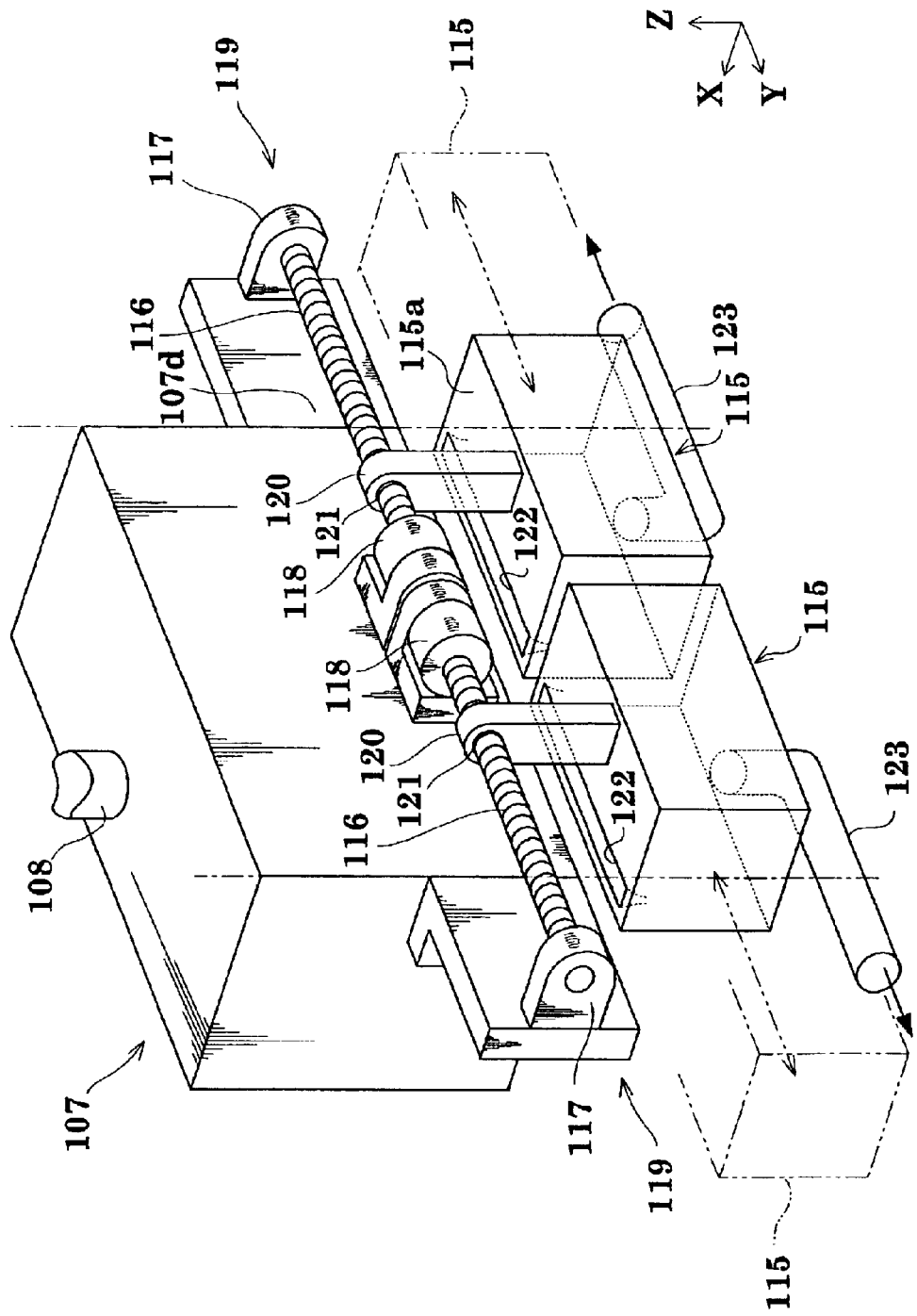
FIG. 10 is a schematic perspective view of a treating solution delivery nozzle.
Figure 11:
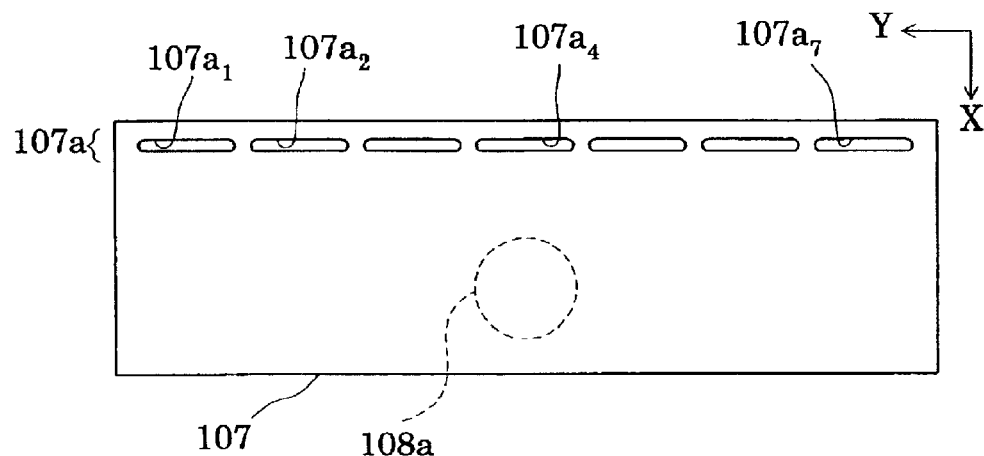
FIG. 11 is a bottom view of the treating solution delivery nozzle.
Figure 12:
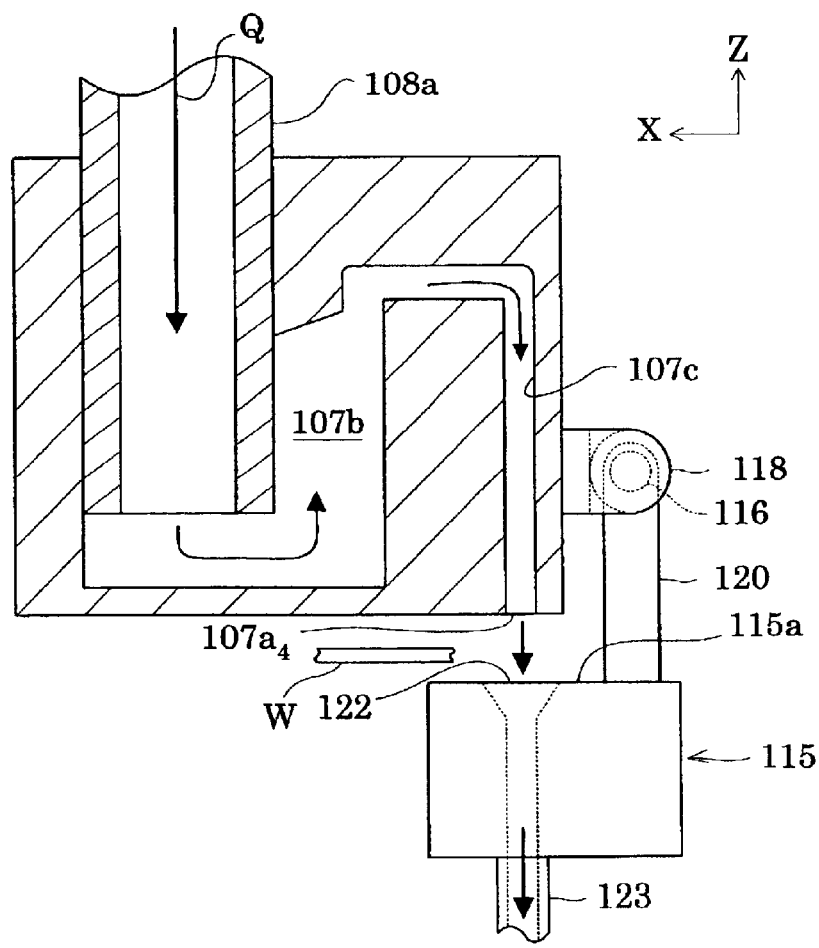
FIG. 12 is a sectional view of the treating solution delivery nozzle taken on line XII—XII of FIG. 8.

Next, the solution delivery nozzle 107 forming one characterizing feature of the invention will be described with reference also to FIGS. 10 through 12. FIG. 10 is a schematic perspective view of the solution delivery nozzle 107. FIG. 11 is a bottom view of the solution delivery nozzle 107. FIG. 12 is a sectional view of the solution delivery nozzle taken on line XII—XII of FIG. 8.

As shown in FIGS. 8 and 11, the solution delivery nozzle (which may be referred to hereinafter simply as "nozzle") 107 has solution discharge openings 107*a* formed in a lower surface thereof for delivering developer Q toward the wafer W. As shown in FIG. 11, the solution discharge openings 107*a* include a plurality of (seven in this embodiment) discharge openings $107a_1$–$107a_7$ in the form of oval-shaped slots arranged such that the longer axes thereof are in alignment. Each oval-shaped slot is 0.1 to 1.0 mm wide and 42 mm long, for example.

As shown in FIG. 12, the nozzle 107 defines therein a solution sump 107*b* for collecting the developer Q received from the solution feed pipe 108*a*, and a solution guide passage 107*c* for guiding the developer Q to the solution discharge openings 107*a*.

With this nozzle 107, the developer Q supplied downward from the solution feed pipe 108*a* to the solution sump 107*b* is turned upward at the bottom of the sump 107*b* to flow into the solution guide passage 107*c*. The developer Q is guided to the discharge openings $107a_1$–$107a_7$ to be delivered therefrom.

Figure 13:
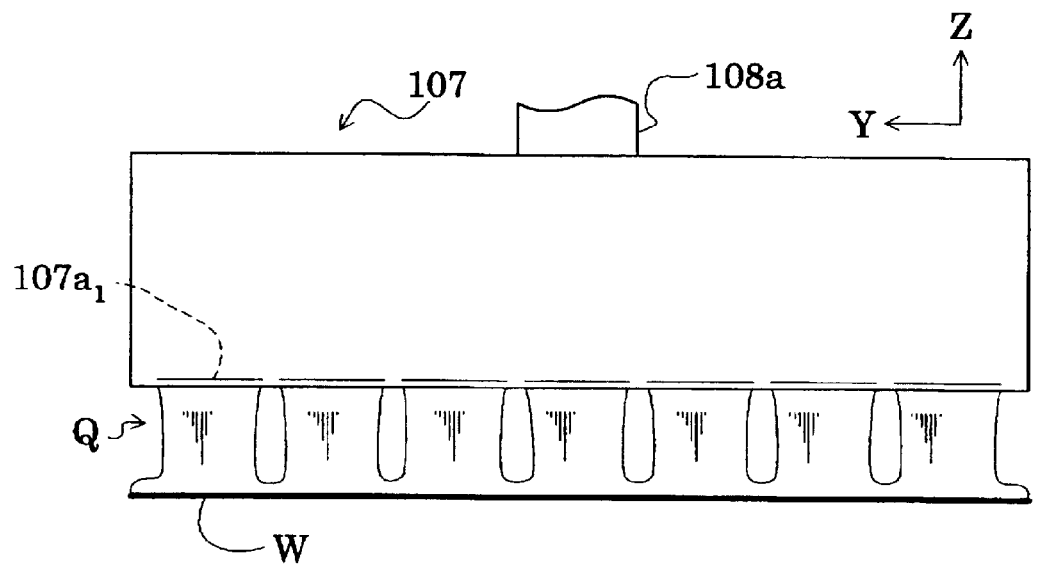
FIG. 13 is a view of a developer being delivered from the treating solution delivery nozzle.
Figure 14:
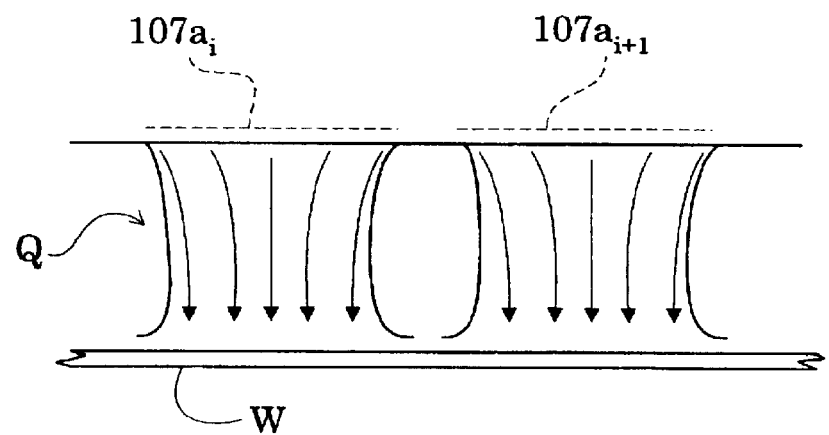
FIG. 14 is a view of the developer being delivered from each discharge opening.

The developer Q being delivered from the solution discharge openings 107*a* of nozzle 107 toward the wafer W will be described with reference to FIGS. 13 and 14. FIG. 13 is a view of the developer Q being delivered from the treating solution delivery nozzle 107. FIG. 14 is a view of the developer Q being delivered from each discharge opening shown in enlargement. As shown in FIG. 13, the developer Q is delivered in a generally strip form from the solution discharge openings 107*a* of the nozzle 107 toward the wafer W. As shown in FIG. 14, the developer delivered from each of the discharge openings $107a_1$–$107a_7$ tapers as it falls away from the discharge opening $107a_n$. However, the tapering is initiated at each of the discharge openings $107a_1$–$107a_7$ and, seen from the wafer W, the developer Q is delivered uniformly in a generally strip form from the solution discharge openings 107*a*.

Figure 15:
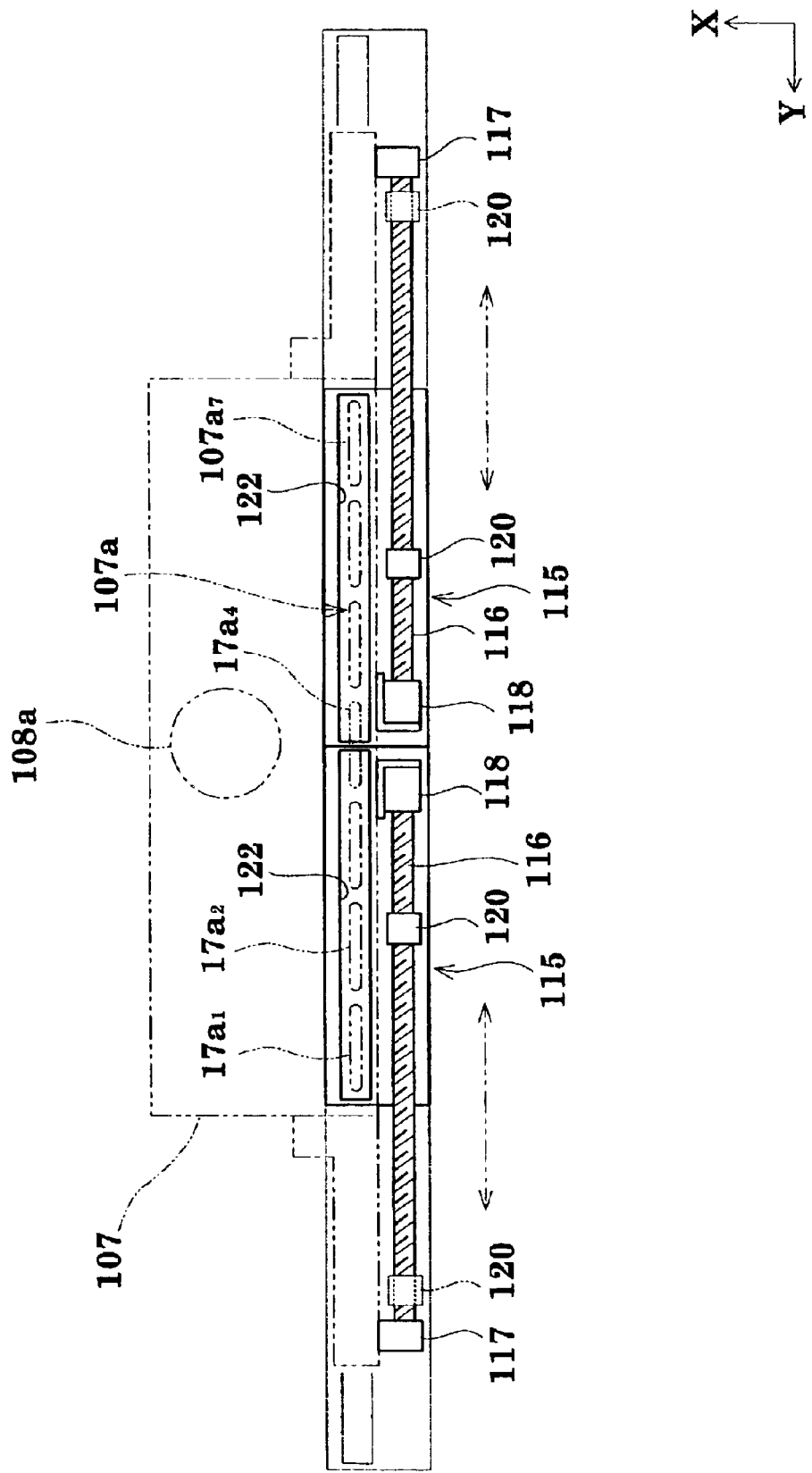
FIG. 15 is a schematic plan view of collecting vessels.
Figure 16:
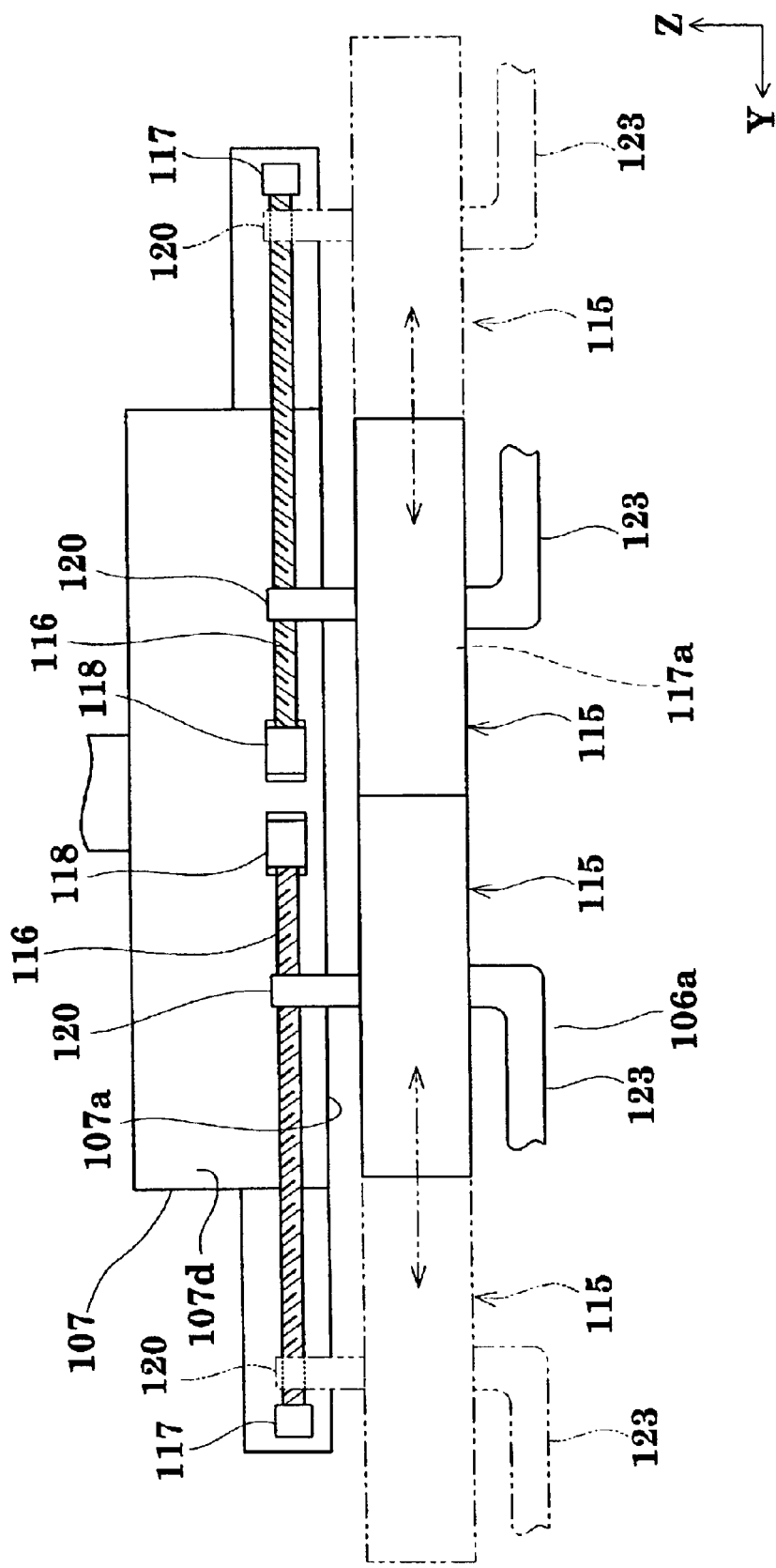
FIG. 16 is a side view of the collecting vessels shown in FIG. 15.

As shown in FIG. 10, two collecting vessels 115 are juxtaposed in the Y-direction adjacent the lower surface of the nozzle 107 for receiving part of the developer Q delivered from the nozzle 107 outwardly of the surface of wafer W. These collecting vessels 115 are movable in the Y-direction as described hereunder. The collecting vessels 115 will be described with reference also to FIGS. 15 and 16. FIG. 15 is a schematic plan view of the collecting vessels 115. FIG. 16 is a side view thereof.

Two collecting vessel drive mechanisms 119 are juxtaposed in the Y-direction along a side surface 107*d* of the nozzle 107. Each drive mechanism 119 includes a feed screw 116 extending in the Y-direction, a bearing 117 for rotatably supporting one end of the feed screw 116, and a motor 118 connected to the other end of the feed screw 116 for rotating the feed screw 116. The collecting vessel 115 at the left in FIG. 10 has a support 120 thereof defining a threaded bore 121 for receiving and engaging the feed screw 116 of the collecting vessel drive mechanism 119 at the left in FIG. 10. The collecting vessel 115 at the right in FIG. 10 has a support 120 thereof defining a threaded bore 121 for receiving and engaging the feed screw 116 of the collecting vessel drive mechanism 119 at the right in FIG. 10. With rotation of each motor 118, the feed screw 116 rotates to move the support 120 of the collecting vessel 115 in the Y-direction, whereby the collecting vessel 115 moves in the Y-direction. Each collecting vessel 115 is movable in opposite directions by rotating the motor 118 forward and backward.

The controller 112 controls the motors 118 according to positions of the nozzle 107 relative to the wafer W detected by the nozzle position detector 114. The collecting vessels 115 are thereby moved longitudinally of the solution discharge openings 107*a* (in the Y-direction) so as to follow edges of the wafer W as spaced therefrom. The term "spaced" here means an appropriate space set in order to prevent the developer Q delivered to the surface of wafer W and used in treatment thereof from flowing into collecting openings 122 of the collecting vessels 115, and allow only the unused part of the developer Q delivered outwardly of the surface of wafer W to flow into the collecting openings 122. The controller 112 and collecting vessel drive mechanisms 119 constitute the collecting vessel moving device of the invention.

The collecting openings 122 formed in the collecting vessels 115 for receiving the developer Q delivered from the nozzle 107 will be described next. As shown in FIGS. 10 and 12, each collecting vessel 115 has, formed in an upper surface 115*a* thereof, the collecting opening 122 of elongate rectangular shape, for example, extending in the Y-direction. As shown in FIG. 15, the collecting vessels 115 are connected to the nozzle 107, with the collecting openings 122 in the upper surface 115*a* disposed below (directly under in this embodiment) and opposed to the solution discharge openings 107*a* of the nozzle 107. Specifically, each collecting opening 122 has a width (i.e. length in the X-direction) (e.g. 1 to 3 mm) slightly larger than the width of the solution discharge openings 107*a* of the nozzle 107, and a length (in the Y-direction) (e.g. 150 mm) half the length in the Y-direction of the solution discharge openings 107*a* of the nozzle 107. As shown in FIG. 12, each collecting opening 122 has a funnel-shaped vertical section. With the funnel shape, the developer Q delivered from the nozzle 107 enters the collecting openings 122 smoothly. In this embodiment the collecting openings 122 have an elongate rectangular shape, but may have a varied elongate shape such as oval.

As shown in FIG. 12, each collecting opening 122 has a height in the Z-direction below the surface of wafer W under treatment. Thus, the part of the developer Q delivered from the solution discharge openings 107a of the nozzle 107 outwardly of the surface of wafer W is collected through the collecting openings 122 of the collecting vessels 115 located below the surface of wafer W under treatment. An inflow rate of the developer Q to the collecting openings 122 is approximately equal to a collection rate of the developer Q through the collecting openings 122. That is, the developer Q flows smoothly into the collecting openings 122 without overflowing the collecting openings 122. Thus, the collecting vessels 115 located adjacent the lower surface of the nozzle 107 never cause variations in the flow rate of developer Q delivered from the solution discharge openings 107a of the nozzle 107.

The width and length of the collecting openings 122 are not limited to the above dimensions. The collecting openings 122 will serve the purpose as long as they are sized to accommodate the developer Q delivered from the solution discharge openings 107a of the nozzle 107.

Figure 18:
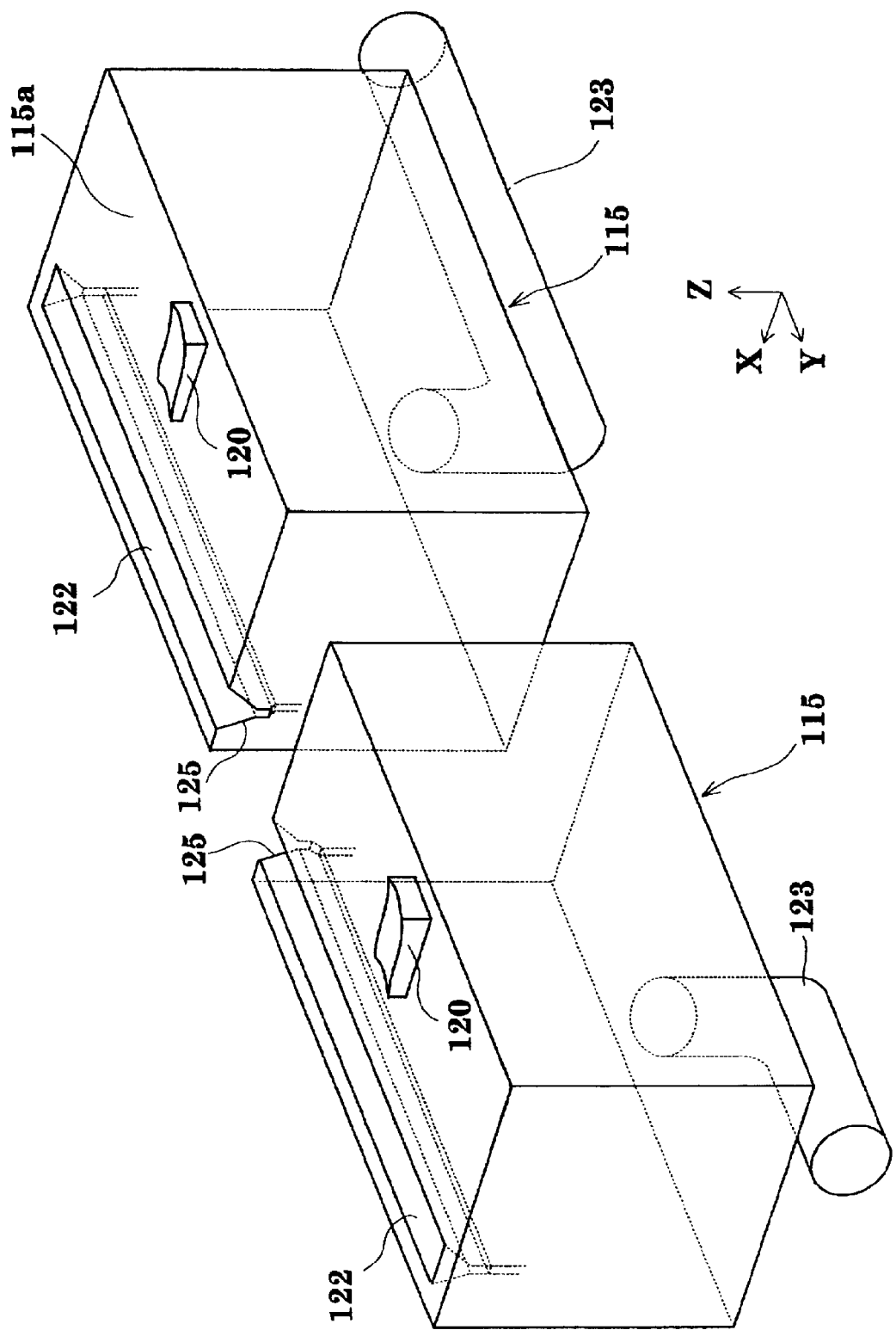
FIG. 18 is a perspective view schematically showing modified collecting vessels.

The distance between the solution discharge openings 107a of the nozzle 107 and the collecting openings 122 of the collecting vessels 115 should preferably be made as short as possible from the viewpoint of minimizing exposure to air of the developer Q delivered from the solution discharge openings 107a of the nozzle 107. As long as the requirement noted hereunder is met, the lower surface of the nozzle 107 and the upper surfaces 115a of the collecting vessels 115 may be placed as close to each other as possible, or may be placed in contact with each other, that is the solution discharge openings 107a of the nozzle 107 and the collecting openings 122 of the collecting vessels 115 may be placed in the same plane. The requirement noted above is that the collecting vessels 115 located adjacent or on the lower surface of the nozzle 107 never cause variations in the flow rate of developer Q delivered from the solution discharge openings 107a of the nozzle 107. As a device that meets this requirement, as shown in FIG. 18, the end of each collecting vessel 115 adjacent the other collecting vessel 115 may define a cutout 125 to be lower in the Z-direction than the surface of wafer W under treatment. When the two collecting vessels 115 juxtaposed in the Y-direction are placed in contact with each other, the two collecting openings 122 are joined to form a single collecting opening in the upper surfaces 115a of the collecting vessels 115. With this construction, even when the collecting vessels 115 are placed in contact with the lower side of the nozzle 107, no variations will occur in the flow rate of developer Q delivered from the solution discharge openings 107a of the nozzle 107.

The above collecting vessels 115 correspond to the collecting vessels of the invention. The collecting openings 122 correspond to the collecting openings of the invention.

As shown in FIGS. 10 and 12, one end of a collecting pipe 123 is connected to a lower portion of each collecting vessel 115. As shown in FIG. 9, the other end of the collecting pipe 123 is connected to the developer tank 111. The developer Q collected inside each collecting vessel 115 through the collecting opening 122 is supplied to the developer tank 111 through the collecting pipe 123. As shown in FIG. 9, the collecting pipe 123 has a developer resupplying unit 124 mounted thereon for supplying the developer Q instead of returning the developer Q to the developer tank 111. The developer resupplying unit 124 includes a pump operable on instructions from the controller 112 to store the developer Q from the collecting pipe 123 in an internal storage tank (not shown), and output the developer Q from this storage tank through a check valve. Thus, the developer Q collected by the collecting vessels 115 may be supplied without returning it to the developer tank 111.

The electric motor 105, nozzle drive mechanism 109, switch valve 113, nozzle position detector 114, collecting vessel drive mechanisms 119 and developer resupplying unit 124 are all connected to the controller 112. The controller 112 controls, in an integrated way, an amount of movement of the nozzle 107, a spinning rate of wafer W, delivery timing of developer Q, an amount of movement of the collecting vessels 115, and supplying of collected developer Q to the developer tank 111.

The above developer resupplying unit 124 corresponds to the supplying device of the invention. The developer tank 111 and developer resupplying unit 124 constitute the circulating device of the invention.

Figure 17:
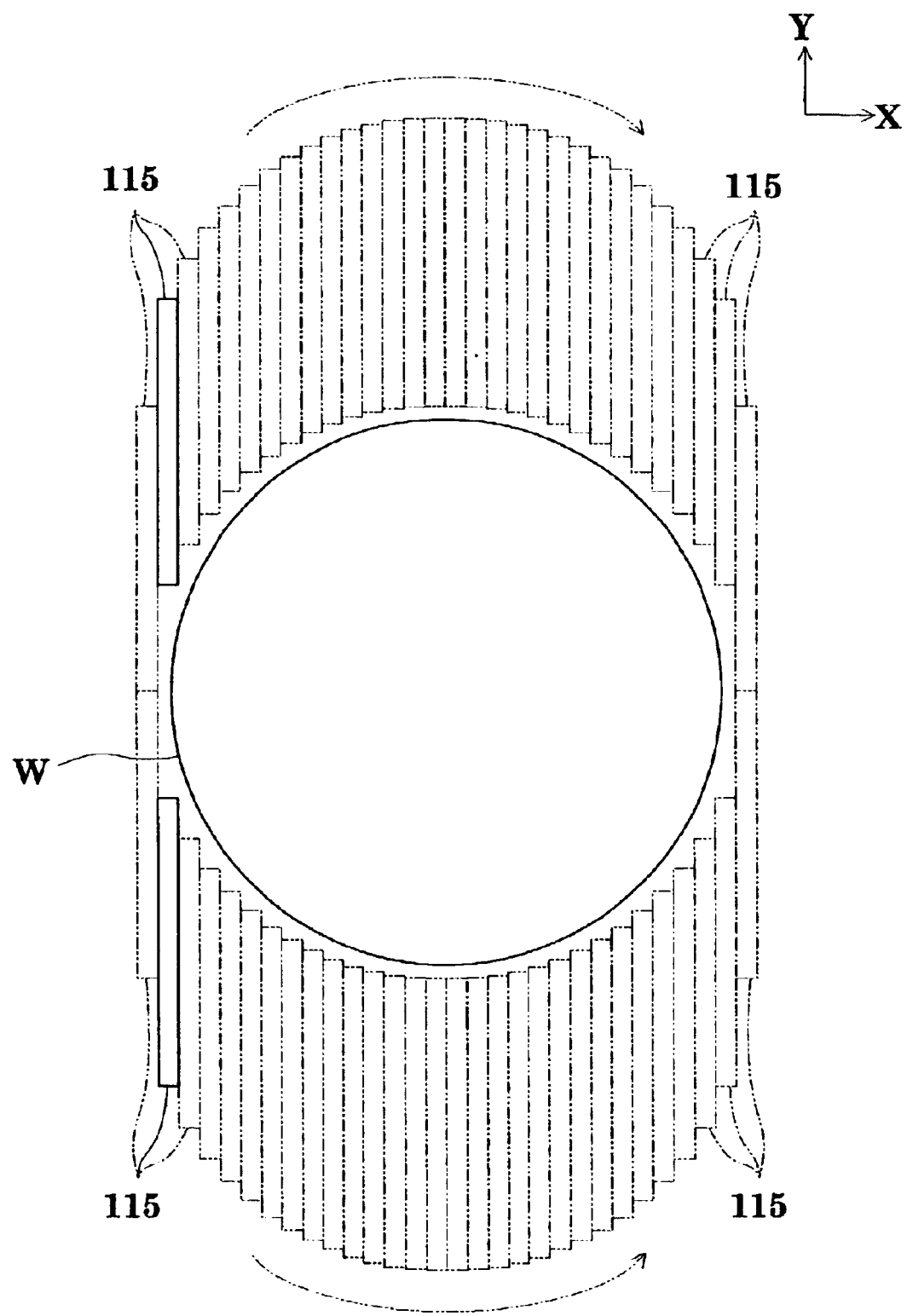
FIG. 17 is an explanatory view showing moving track of the collecting vessels in time of the developer being delivered from the nozzle to the substrate.

Next, operation of the substrate developing apparatus will be described with reference to FIG. 17 as well as FIGS. 8 and 9. FIG. 17 is an explanatory view showing moving tracks of the collecting vessels 115 in time of delivering the developer Q from the nozzle 107 to the wafer W.

When a substrate transport mechanism not shown carries in and places the wafer W on the wafer holder 101, the wafer holder 101 holds the wafer W by suction. At substantially the same time, the nozzle drive mechanism 109 raises the support arm 108 to move the nozzle 107 supported by the support arm 108 up from the standby pot 106a. Further, the nozzle drive mechanism 109 moves along the guide rail 110 to move the nozzle 107 to a development starting position in the outer cup 104. Then, the nozzle drive mechanism 109 lowers the support arm 108 to bring the nozzle 107 down to a treatment starting height. At this time, as shown solid lines in FIGS. 15 and 16, the two collecting vessels 115 lie adjacent each other below the solution discharge openings 107a of the nozzle 107.

Then, the controller 112 opens the switch valve 113 to supply the developer Q from the developer tank 111 to the nozzle 107 through the solution supply line 111a and solution feed line 108a. Upon receipt of the developer Q, the nozzle 107 delivers the developer Q from the solution discharge openings 107a. The developer Q delivered from the solution discharge openings 107a is collected at the collecting openings 122 of the two collecting vessels 115.

When the nozzle 107 starts delivering the developer Q, the nozzle drive mechanism 109 moves again at a fixed speed in the X-direction along the guide rail 110. With this movement, as shown in FIG. 17, the two collecting vessels 115 disposed below the solution discharge openings 107a move longitudinally of the solution discharge openings 107a (in the Y-direction) so as to follow the peripheral edges of wafer W as spaced therefrom. Besides, the nozzle 107 delivers the developer Q to the wafer W while moving at the fixed speed over the surface of wafer W in the X-direction. The developer Q delivered to the surface of wafer W is retained (in a puddle) thereon by surface tension. Unused part of the developer Q delivered outwardly of the surface of wafer W is collected at the collecting openings 122 of the collecting vessels 115 moving below the nozzle 107 along the peripheral edges of wafer W as spaced therefrom. As noted hereinbefore, the developer Q is delivered in a generally strip form from the nozzle 107 toward the wafer W (see FIGS. 13 and 14).

When the nozzle 107 moving over the wafer W reaches a position past the wafer W, the controller 112 closes the switch valve 113 to end the delivery of developer Q from the nozzle 107. When the nozzle 107 reaches a stopping position inside the outer cup 104, the nozzle drive mechanism 109 stops once, raises the nozzle 107, and moves to the other standby pot 106b to put the nozzle 107 on standby in the standby pot 106b.

The step of delivering the developer Q in a generally strip form from the solution discharge openings 107a of the nozzle 107 toward the wafer W in horizontal posture corresponds to the treating solution delivering step of the invention. The step of moving the nozzle 107 over the wafer W corresponds to the horizontally moving step of the invention. The step of receiving the developer Q delivered from the nozzle 107 outwardly of the surface of wafer W at the elongate collecting openings 122 of the collecting vessels 115 below and opposed to the solution discharge openings 107a of the nozzle 107 corresponds to the treating solution collecting step of the invention.

The wafer holder 101 maintains the puddle of developer Q formed on the wafer W for a fixed time. During this period, developing treatment is effected by the developer Q on the wafer W. Upon lapse of the fixed time, the inner cup 102 is raised to prevent the developer Q from scattering to the ambient, and then the wafer holder 101 spins at high speed to scatter the developer Q from the wafer W. After post-development treatment such as rinsing, the inner cup 102 is lowered, and the wafer W is unloaded by the substrate transport mechanism to complete the series of developing steps.

According to the substrate developing apparatus in this embodiment, as described above, since the solution discharge openings 107a of the nozzle 107 have an invariable delivery area, variations due to variations in the delivery area never occur in the flow rate of developer Q but the developer Q is delivered at a fixed rate from the nozzle 107 to the wafer W. Thus, the wafer W is free from uneven development due to variations in the flow rate of developer Q delivered to the wafer W. This dispenses with a flow rate control mechanism of complicated construction for controlling the flow rate of developer Q delivered from the nozzle 107 to be constant despite variations in the delivery area of the nozzle 107. Further, the part of developer Q delivered from the nozzle 107 outwardly of the wafer W is collected at elongate collecting openings 122 of the collecting vessels 115 opposed to the solution discharge openings 107a of the nozzle 107. The developer Q is exposed to air only from delivery from the solution discharge openings 107a until arrival at the collecting openings 122. This reduces the exposure to air of the developer Q, thereby reducing variations in characteristics due to the exposure to air of the developer Q.

The collecting vessels 115 are moved longitudinally of the solution discharge openings 107a (in the Y-direction) so as to follow the peripheral edges of wafer W as spaced therefrom. This arrangement prevents the developer Q delivered to the surface of wafer W, i.e. the developer Q supplied for substrate treatment, from flowing into the collecting openings 122 of the collecting vessels 115, and collects through the collecting openings 122 only unused part of the developer Q, i.e. the developer Q delivered outwardly of the surface of wafer W and not supplied for substrate treatment, resulting in high quality of the developer Q collected.

Since each of the two collecting vessels 115 moves longitudinally of the solution discharge openings 107a (in the Y-direction) so as to follow the peripheral edge of wafer W as spaced therefrom, the two collecting vessels 115 can collect unused developer Q delivered outwardly of the surface of wafer W at opposite ends of the nozzle 107.

Since each collecting opening 122 has a funnel-shaped vertical section, the developer Q delivered from the nozzle 107 may enter the collecting opening 122 smoothly.

Further, the collecting vessels 115 are connected to the nozzle 107. This dispenses with a moving device, separate from the nozzle drive mechanism 109 for moving the collecting vessels 115 when the nozzle 107 is moved relative to the wafer holder 101 acting as the substrate supporting device.

The unused developer Q delivered outwardly of the surface of wafer W is collected at the collecting openings 122 of the collecting vessels 115, and delivered from the nozzle 107. In this way, the unused developer Q is recycled for effective use.

The substrate developing apparatus with the nozzle 107 described above delivers the developer Q in a generally strip form toward the wafer W. Thus, the developer Q without degradation in developing performance may always be delivered substantially uniformly, without increasing flow rate, over the entire surface of wafer W under treatment. As a result, the entire surface of wafer W under treatment may be developed uniformly. Since the developer is supplied to the wafer W gently, no damage is done to the resist film.

The present invention may be implemented in the following modified forms also:

(1) In the above embodiment, the nozzle 107 is moved while the wafer W is maintained still. The invention is applicable also where the wafer W is moved instead.

(2) In the above embodiment, while the treating solution (e.g. developer Q) is delivered to the wafer W, the collecting vessels 115 are moved longitudinally of the solution discharge openings 107a (in the Y-direction) so as to follow the peripheral edges of wafer W as spaced therefrom. Instead of moving the collecting vessels 115 in the Y-direction to be clear of the wafer holder 101 and wafer W, the collecting vessels 115 may be fixed with portions thereof disposed under the wafer W. In this case, the developer Q delivered to the surface of wafer W, i.e. the developer Q supplied for substrate treatment, may flow into the collecting openings 122 of the collecting vessels 115. Even so, since the solution discharge openings 107a of the nozzle 107 have an invariable delivery area, variations due to variations in the delivery area never occur in the flow rate of developer Q but the developer Q is delivered at a fixed rate from the nozzle 107 to the wafer W. Thus, the wafer W is still free from uneven development due to variations in the flow rate of developer Q delivered to the wafer W.

(3) In the above embodiment, the two collecting vessels 115 are used to collect the treating solution (e.g. developer Q) delivered outwardly of the surface of wafer W. Instead, a single collecting vessel 115 may be used for this purpose. In this case, the treating solution delivered outwardly of the surface of wafer W is collected with reduced efficiency, but the treating solution collected may still be recycled.

(4) The apparatus in the above embodiment includes two collecting vessel drive mechanisms 119 for driving the two collecting vessels 115 individually and independently of each other. Instead, the two collecting vessels 115 may be driven by a single collecting vessel drive mechanism. This single collecting vessel drive mechanism may, for example, include a guide rail extending in the Y-direction along the side surface 107d of the nozzle 107, two sliders mounted on the guide rail, and a telescopic mechanism extendible and contractible between the two sliders and having opposite ends abutting on the sliders. The two collecting vessels 115 are connected to the sliders, respectively. The collecting vessels 115 are interlocked to the telescopic mechanism to move away from and toward each other with extension and contraction of the telescopic mechanism.

(5) In the above embodiment, the treating solution (e.g. developer Q) collected in the collecting vessels 115 is supplied to the developer tank 111 to be delivered from the nozzle 107. Instead, the treating solution may be supplied from the collecting vessels 115 directly to the nozzle 107.

Figure 19A:
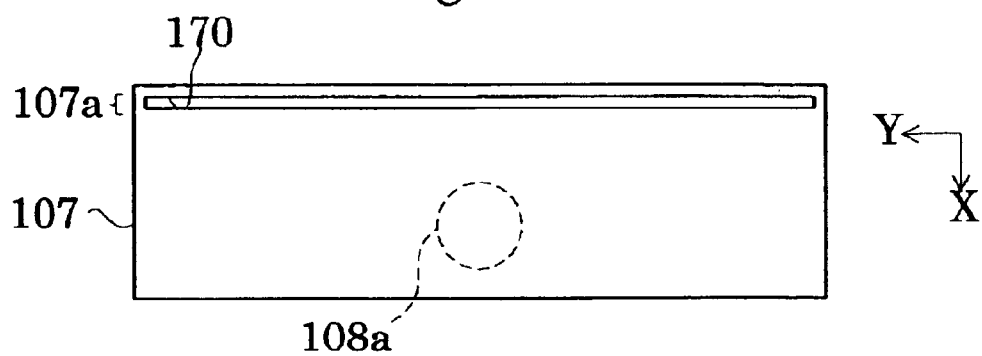
FIGS. 19A through 19C are plan views of modified solution discharge openings of the nozzle.
Figure 19B:
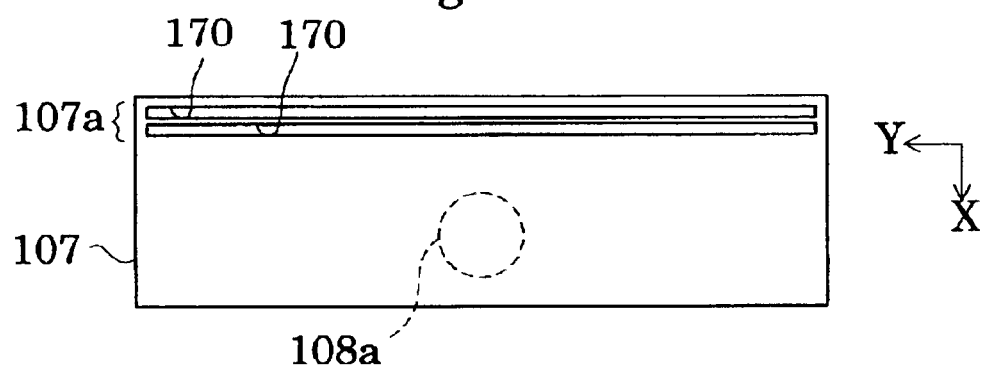
Figure 19C:
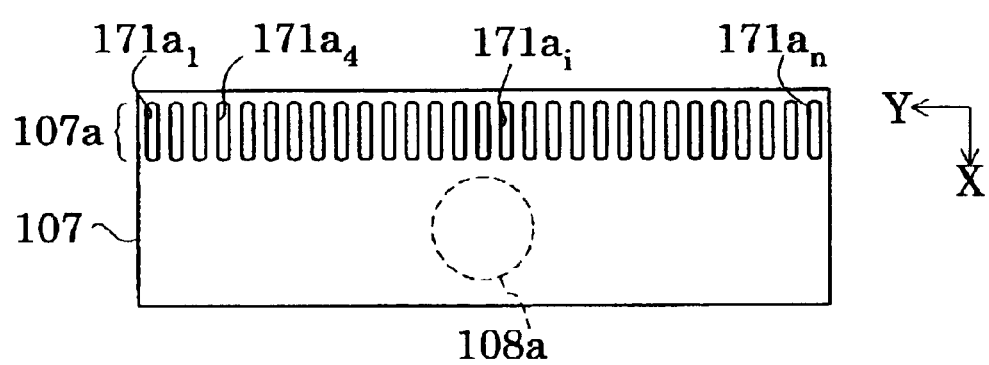

(6) In the above embodiment, as shown in FIG. 11, the solution discharge openings 107a of the nozzle 107 include a plurality of (e.g. seven) discharge openings $107a_1$–$107a_7$ in the form of oval-shaped slots aligned in the Y-direction. As shown in FIG. 19A, the discharge openings 107a of the nozzle 107 may be integrated into a single slit-shaped discharge slot 170 elongated in the Y-direction. This single slot is, for example, 0.1 to 1.0 mm wide and 8 inches or 300 mm long. As shown in FIG. 19B, the discharge openings 107a of the nozzle 107 may be a plurality of (e.g. two) such slots 170 juxtaposed in the X-direction. As shown in FIG. 19C, the solution discharge openings 107a of the nozzle 107 may be oval-shaped slots $107a_1$–$107a_n$, n in number, arranged side by side and in parallel. Whichever form and arrangement are employed for the solution discharge openings 107a of the nozzle 107, the collecting opening or openings 122 of the collecting vessels 115 may be sized according to the size of the solution discharge openings.

(7) While the above embodiment has been described in relation to the developing apparatus, the invention is not limited to such apparatus, but has wide application to varied substrate treating apparatus, and to solution delivery nozzles for use in these apparatus, for treating substrates by delivering appropriate treating solutions (e.g. a resist solution and rinse solution) to substrate surfaces.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus for performing a predetermined treatment of a substrate by supplying a treating solution thereto, said apparatus comprising:

substrate support means for supporting said substrate in horizontal posture;

a treating solution delivery nozzle having a solution discharge opening for delivering the treating solution to said substrate, said solution discharge opening being in form of a slit or a plurality of small perforations arranged in a lower surface of said treating solution delivery nozzle;

horizontally moving means for moving said treating solution delivery nozzle horizontally relative to the substrate; and collecting vessel means defining a collecting opening for receiving said treating solution delivered from said treating solution delivery nozzle, said collecting opening being disposed below said treating solution delivery nozzle to be opposed to said solution discharge opening of said treating solution delivery nozzle, said collecting vessel means receiving and collecting part of the treating solution delivered from said treating solution delivery nozzle outwardly of said substrate; and further comprising:

nozzle position detecting means for detecting positions of said treating solution delivery nozzle relative to said substrate; and collecting vessel moving means for moving said collecting vessel means longitudinally of said solution discharge opening in response to the positions of said treating solution delivery nozzle detected by said nozzle position detecting means;

said collecting vessel means being movable longitudinally of said solution discharge opening by said collecting vessel moving means so as to follow peripheral edges of said substrate as spaced therefrom.

2. A substrate treating apparatus as defined in claim 1, wherein said collecting vessel means includes two collecting vessels juxtaposed longitudinally of said solution discharge opening, said solution discharge opening having a length bisected to define a first range and a second range, one of said collecting vessels being movable over said first range, and the other of said collecting vessels being movable over said second range.

3. A substrate treating apparatus for performing a predetermined treatment of a substrate by supplying a treating solution thereto, said apparatus comprising:

substrate support means for supporting said substrate in horizontal posture;

a treating solution delivery nozzle having a solution discharge opening for delivering the treating solution to said substrate, said solution discharge opening being in form of a slit or a plurality of small perforations arranged in a lower surface of said treating solution delivery nozzle;

horizontally moving means for moving said treating solution delivery nozzle horizontally relative to the substrate; and collecting vessel means defining a collecting opening for receiving said treating solution delivered from said treating solution delivery nozzle, said collecting opening being disposed below said treating solution delivery nozzle to be opposed to said solution discharge opening of said treating solution delivery nozzle, said collecting vessel means receiving and collecting part of the treating solution delivered from said treating solution delivery nozzle outwardly of said substrate;

wherein said horizontally moving means is arranged to move said treating solution delivery nozzle horizontally, and said collecting vessel means is horizontally movable synchronously with said treating solution delivery nozzle.

4. A substrate treating apparatus as defined in claim 3, wherein said collecting vessel means is connected to said treating solution delivery nozzle.

5. A substrate treating apparatus for performing a predetermined treatment of a substrate by supplying a treating solution thereto, said apparatus comprising:

substrate support means for supporting said substrate in horizontal posture;

a cup for surrounding said substrate supported by said substrate support means;

a treating solution delivery nozzle having a solution discharge opening for delivering the treating solution to said substrate, said solution discharge opening being in form of a slit or a plurality of small perforations arranged in a lower surface of said treating solution delivery nozzle;

horizontally moving means for moving said treating solution delivery nozzle horizontally relative to the substrate; and collecting vessel means arranged around said cup for collecting part of the treating solution delivered from said treating solution delivery nozzle outwardly of said substrate;

wherein said collecting vessel means is divided into a plurality of collecting vessels as seen in plan, each of said collecting vessels being movable between a collecting position for collecting the part of the treating solution delivered from said treating solution delivery nozzle outwardly of said substrate, and a retracted position.

6. A substrate treating apparatus as defined in claim 5, wherein said collecting vessel means has a surface opposed and close to said cup, shaped to follow an outer profile of said cup.

7. A substrate treating apparatus as defined in claim 5, wherein said collecting vessel means is connected to a treating solution storage tank through collecting piping.

8. A substrate treating apparatus as defined in claim 7, wherein said collecting piping has a switch valve mounted thereon.

9. A substrate treating apparatus as defined in claim 5, further comprising cleaning and drying means for cleaning and drying inner surfaces of said collecting vessel means.

10. A substrate treating apparatus as defined in claim 5, wherein said treating solution is a developer.

11. A substrate treating apparatus for performing a predetermined treatment of a substrate by supplying a treating solution thereto, said apparatus comprising:
   substrate support means for supporting said substrate in horizontal posture;
   a cup for surrounding said substrate supported by said substrate support means;
   a treating solution delivery nozzle having a solution discharge opening for delivering the treating solution to said substrate, said solution discharge opening being in form of a slit or a plurality of small perforations arranged in a lower surface of said treating solution delivery nozzle;
   horizontally moving means for moving said treating solution delivery nozzle horizontally relative to the substrate; and
   collecting vessel means arranged around said cup for collecting part of the treating solution delivered from said treating solution delivery nozzle outwardly of said substrate;
   wherein said collecting vessel means is vertically movable with said cup between a collecting position for collecting the part of the treating solution delivered from said treating solution delivery nozzle outwardly of said substrate, and a retracted position.

12. A substrate treating apparatus as defined in claim 11, wherein said collecting vessel means has a surface opposed and close to said cup, shaped to follow an outer profile of said cup.

13. A substrate treating apparatus as defined in claim 11, wherein said collecting vessel means is connected to a treating solution storage tank through collecting piping.

14. A substrate treating apparatus as defined in claim 13, wherein said collecting piping has a switch valve mounted thereon.

15. A substrate treating apparatus as defined in claim 11, further comprising cleaning and drying means for cleaning and drying inner surfaces of said collecting vessel means.

16. A substrate treating apparatus as defined in claim 11, wherein said treating solution is a developer.

17. A substrate treating apparatus for performing a predetermined treatment of a substrate by supplying a treating solution thereto, said apparatus comprising:
   substrate support means for supporting said substrate in horizontal posture;
   a cup for surrounding said substrate supported by said substrate support means;
   a treating solution delivery nozzle having a solution discharge opening for delivering the treating solution to said substrate, said solution discharge opening being in form of a slit or a plurality of small perforations arranged in a lower surface of said treating solution delivery nozzle;
   horizontally moving means for moving said treating solution delivery nozzle horizontally relative to the substrate; and
   collecting vessel means arranged around said cup for collecting part of the treating solution delivered from said treating solution delivery nozzle outwardly of said substrate;
   wherein said collecting vessel means is independent fixed vessel means having an inner wall separate from said cup and an outer wall surrounding said inner wall, said cup being vertically movable to switch said collecting vessel means between a collecting state for collecting the part of the treating solution delivered from said treating solution delivery nozzle outwardly of said substrate, and a retracted state.

18. A substrate treating apparatus as defined in claim 17, wherein said collecting vessel means has a surface opposed and close to said cup, shaped to follow an outer profile of said cup.

19. A substrate treating apparatus as defined in claim 17, wherein said collecting vessel means is connected to a treating solution storage tank through collecting piping.

20. A substrate treating apparatus as defined in claim 19, wherein said collecting piping has a switch valve mounted thereon.

21. A substrate treating apparatus as defined in claim 17, further comprising cleaning and drying means for cleaning and drying inner surfaces of said collecting vessel means.

22. A substrate treating apparatus as defined in claim 17, wherein said treating solution is a developer.

23. A substrate treating apparatus for performing a predetermined treatment of a substrate by supplying a treating solution thereto, said apparatus comprising:
   substrate support means for supporting said substrate in horizontal posture;
   a treating solution delivery nozzle having a solution discharge opening for delivering the treating solution to said substrate, said solution discharge opening being in form of a slit or a plurality of small perforations arranged in a lower surface of said treating solution delivery nozzle;
   horizontally moving means for moving said treating solution delivery nozzle horizontally relative to the substrate; and
   collecting vessel means defining an elongate collecting opening for receiving said treating solution delivered from said treating solution delivery nozzle, said collecting opening being disposed below said treating solution delivery nozzle to be opposed to said solution discharge opening of said treating solution delivery nozzle, said collecting vessel means being connected to said treating solution delivery nozzle to be movable with said treating solution delivery nozzle by said horizontally moving means horizontally relative to said substrate, for receiving and collecting part of the treating solution delivered from said treating solution delivery nozzle outwardly of said substrate.

24. A substrate treating apparatus as defined in claim 23, further comprising:

nozzle position detecting means for detecting positions of said treating solution delivery nozzle relative to said substrate; and collecting vessel moving means for moving said collecting vessel means longitudinally of said solution discharge opening in response to the positions of said treating solution delivery nozzle detected by said nozzle position detecting means;

said collecting vessel means being movable longitudinally of said solution discharge opening by said collecting vessel moving means so as to follow peripheral edges of said substrate as spaced therefrom.

25. A substrate treating apparatus as defined in claim 24, wherein said collecting vessel means includes two collecting vessels juxtaposed longitudinally of said solution discharge opening, said solution discharge opening having a length bisected to define a first range and a second range, one of said collecting vessels being movable over said first range, and the other of said collecting vessels being movable over said second range.

26. A substrate treating apparatus as defined in claim 23, wherein said collecting opening has a funnel-shaped vertical section.

27. A substrate treating apparatus as defined in claim 23, wherein said horizontally moving means is arranged to move said treating solution delivery nozzle horizontally, and said collecting vessel means is horizontally movable synchronously with said treating solution delivery nozzle.

28. A substrate treating apparatus as defined in claim 27, wherein said collecting vessel means is connected to said treating solution delivery nozzle.

29. A substrate treating apparatus as defined in claim 23, further comprising circulating means for supplying the treating solution collected through said collecting opening to said treating solution delivery nozzle to be delivered from said treating solution delivery nozzle.

30. A substrate treating apparatus as defined in claim 29, wherein said circulating means includes:

treating solution storage means connected to said treating solution delivery nozzle for storing the treating solution to be supplied to said treating solution delivery nozzle; and supplying means connected to said collecting vessel means for supplying the treating solution collected in said collecting vessel means to said treating solution storage means.

31. A substrate treating apparatus as defined in claim 23, wherein said treating solution is a developer.

* * * * *